(12) United States Patent  
Takemura

(10) Patent No.: US 9,106,223 B2
(45) Date of Patent: Aug. 11, 2015

(54) SIGNAL PROCESSING DEVICE

(71) Applicant: SEMICONDUCTOR ENERGY LABORATORY CO., LTD., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/278,436

(22) Filed: May 15, 2014

(65) Prior Publication Data

US 2014/0340117 A1  Nov. 20, 2014

(30) Foreign Application Priority Data

May 20, 2013 (JP) ................................. 2013-105904

(51) Int. Cl.
*H01L 25/00* (2006.01)
*H03K 19/0185* (2006.01)
*H03K 19/177* (2006.01)

(52) U.S. Cl.
CPC .. *H03K 19/018585* (2013.01); *H03K 19/17728* (2013.01)

(58) Field of Classification Search
CPC ............... H03K 19/018585; H03K 19/17728; H03K 19/17736
USPC .................................................. 326/47, 113
See application file for complete search history.

(56) References Cited

U.S. PATENT DOCUMENTS

| 5,930,161 | A | * | 7/1999 | Sheikholeslami et al. . | 365/49.13 |
| 6,127,702 | A | | 10/2000 | Yamazaki et al. | |
| 6,552,576 | B1 | * | 4/2003 | Bobba et al. ................... | 326/113 |
| 7,315,196 | B2 | * | 1/2008 | Wada ............................. | 327/536 |
| 7,450,412 | B2 | * | 11/2008 | Kameyama et al. .......... | 365/154 |
| 8,547,753 | B2 | | 10/2013 | Takemura et al. | |
| 2005/0093613 | A1 | * | 5/2005 | Nazarian et al. .............. | 327/536 |
| 2005/0201141 | A1 | * | 9/2005 | Turner .......................... | 365/149 |
| 2008/0024165 | A1 | * | 1/2008 | Madurawe et al. ............ | 326/41 |
| 2008/0169836 | A1 | * | 7/2008 | Rahim et al. .................... | 326/41 |

(Continued)

OTHER PUBLICATIONS

Ishii.T et al., "A Poly-Silicon TFT With a Sub-5-nm Thick Channel for Low-Power Gain Cell Memory in Mobile Applications,". IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

(Continued)

*Primary Examiner* — Don Le
(74) *Attorney, Agent, or Firm* — Fish & Richardson P.C.

(57) ABSTRACT

A signal processing device is produced. The signal processing device including a first transistor with high off-state resistance, a second transistor which controls conduction between two different nodes, a capacitor which holds electric charge, and a current control element such as a transistor or a resistor. The first node to which a gate of the second transistor and a second electrode of the current control element are connected, and the second node to which one of a source and a drain of the first transistor, a first electrode of the capacitor, and a first electrode of the current control element are connected. The capacitance (including a parasitic capacitance) of the second node is greater than ten times the capacitance (including a parasitic capacitance) of the first node. The capacitance does not affect the first node; thus, a boosting effect is large and charge retention characteristics are favorable.

18 Claims, 14 Drawing Sheets

(56) References Cited

U.S. PATENT DOCUMENTS

2010/0148171 A1    6/2010   Hayashi et al.
2011/0175646 A1    7/2011   Takemura et al.
2012/0037972 A1    2/2012   Yoneda
2012/0146705 A1*   6/2012   Den Besten ............... 327/333
2012/0212995 A1    8/2012   Kurokawa
2012/0293200 A1    11/2012  Takemura

OTHER PUBLICATIONS

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

Eslami.F et al.,"Capacitive Boosting for FPGA Interconnection Networks", 21st International Conference on Field Programmable Logic and Applications, vol. 21, pp. 453-458, 2011.

* cited by examiner

150

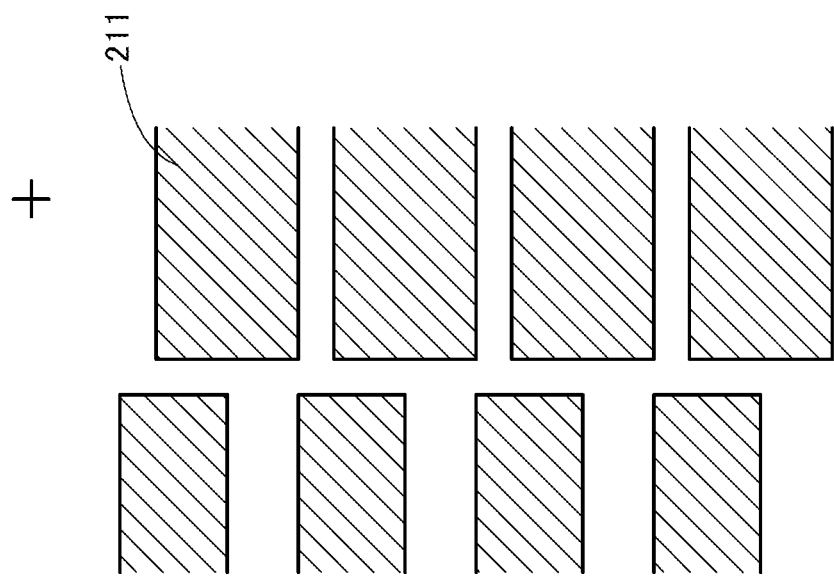
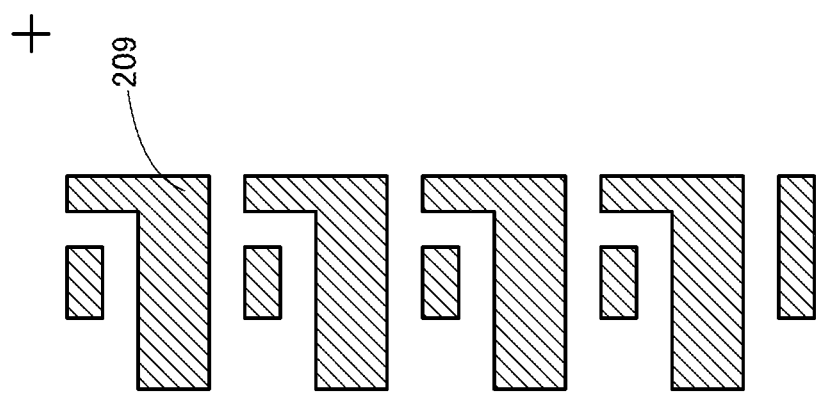

SIGNAL PROCESSING DEVICE

BACKGROUND OF THE INVENTION

1. Field of the Invention

This disclosure relates to a signal processing device.

2. Description of the Related Art

For example, Patent Documents 1 to 3 disclose a signal processing device (a programmable logic device: PLD) which controls connection between a pair of nodes through a source and a drain of a pass transistor. In the signal processing device, the potential of a gate of the pass transistor is kept by turning off a transistor which uses an oxide semiconductor or the like. The transistor including an oxide semiconductor or the like can have extremely high off-state resistance. Therefore, in the signal processing device, the on/off state of the pass transistor can be maintained for a long time.

REFERENCE

Patent Document

[Patent Document 1] U.S. Pat. No. 8,547,753
[Patent Document 2] United States Patent Application Publication No. 2012/0212995
[Patent Document 3] United States Patent Application Publication No. 2012/0293200

SUMMARY OF THE INVENTION

A signal processing device with a novel circuit configuration is provided.

One embodiment is a programmable signal processing device including a first transistor with high off-state resistance, a second transistor which controls conduction between two different nodes, a capacitor which holds electric charge, a current control element such as a transistor or a resistor, a first node to which a gate of the second transistor and a second electrode of the current control element are connected, and a second node to which one of a source and a drain of the first transistor, a first electrode of the capacitor, and a first electrode of the current control element are connected. The capacitance (including a parasitic capacitance) of the second node is greater than ten times the capacitance (including a parasitic capacitance) of the first node.

In the case where the current control element is a transistor, the first electrode and the second electrode correspond to a source and a drain. When a gate of the transistor (the current control element) is connected to a gate of the first transistor, conduction between the source (the first electrode) and the drain (the second electrode) is synchronized with the on/off state of the first transistor. Note that the first transistor may have a backgate.

A programmable logic device with favorable characteristics can be obtained. For example, because the capacitor does not affect the first node, a large boosting effect and favorable charge retention characteristics can be obtained. Note that in addition to these effects, other effects to be described below can be obtained.

BRIEF DESCRIPTION OF THE DRAWINGS

FIGS. 14A and 14B illustrate examples of layout of main components of a programmable logic device.

DETAILED DESCRIPTION OF THE INVENTION

Hereinafter, embodiments of the present invention will be described in detail with reference to the accompanying drawings. However, the embodiments are not limited to the following description, and it will be easily understood by those skilled in the art that various changes can be made to the embodiment and details thereof without departing from the spirit and the scope. Therefore, the description disclosed in this disclosure is not interpreted as being limited to the description of Embodiments below.

Note that a "source" of a transistor also means a source region that is part of a semiconductor film functioning as an active layer or a source electrode electrically connected to the semiconductor film. Similarly, a "drain" of a transistor also means a drain region that is part of a semiconductor film functioning as an active layer or a drain electrode electrically connected to the semiconductor film. A "gate" also means a gate electrode.

Embodiment 1

Figure 1A:
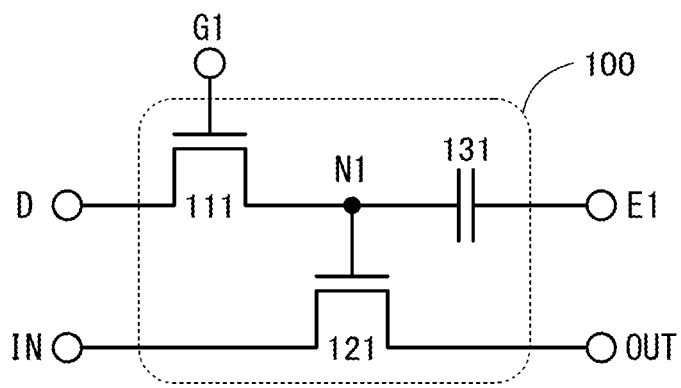
FIGS. 1A to 1C illustrate circuit examples of a signal processing device.
Figure 1B:
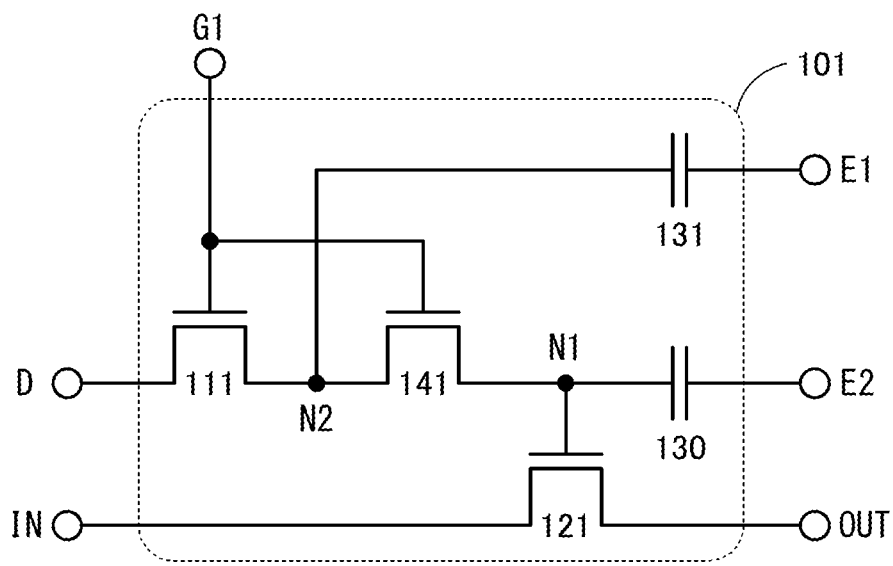
Figure 1C:
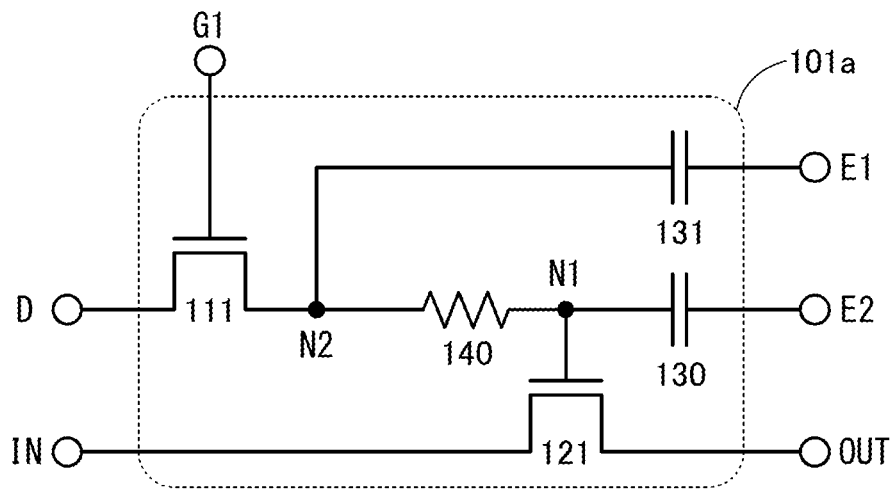

FIGS. 1A to 1C each illustrate an example of a circuit used in a signal processing device. In a programmable switch 100 in FIG. 1A, conduction between a source and a drain of a pass transistor 121 is controlled by the potential of a gate of the pass transistor 121. In the programmable switch 100, the gate of the pass transistor 121 is connected to one of a source and a drain of a writing transistor 111. The on/off of the writing transistor 111 is controlled by the potential of a writing control terminal G1.

Further, a capacitor 131 is provided. The capacitor 131 includes a capacitance that is generated not only intentionally but also unintentionally (parasitic capacitance). In this example, one electrode of the capacitor 131 is connected to the gate of the pass transistor 121 (a node N1), and the other electrode is connected to a capacitor potential supply terminal E1.

As the writing transistor 111, any kind of transistor can be used. In addition, the writing transistor 111 needs to have sufficiently high off-state resistance in order to keep the potential of the gate of the pass transistor 121 (the node N1) for required time. As the writing transistor 111, any of the transistors disclosed in Patent Documents 1 to 3 can be used.

As the pass transistor 121, any kind of transistor can be used. In addition, it is preferable that the pass transistor 121 has low on-state resistance. Furthermore, the pass transistor 121 can be either an N-channel transistor or a P-channel transistor. Hereinafter, the case where the pass transistor 121 is an N-channel transistor is described.

For example, the writing transistor 111 is turned on in a state where both potentials of the source and the drain of the pass transistor 121 are low. Then, the potential of a data input terminal D is set at an appropriate potential so that a difference between the potential of the node N1 and the low potential becomes higher than the threshold of the pass transistor 121. This turns on the pass transistor 121. Even if the writing transistor 111 is turned off after that, the on state of the pass transistor 121 is maintained. This is because the potential of the node N1 is kept by a capacitor formed between the gate and a channel of the pass transistor 121 and the capacitor 131.

The potential of the node N1 might not be kept for required time in the following case, for example. First, the writing transistor 111 is turned on in a state where both potentials of the source and the drain of the pass transistor 121 are low, and then the potential of the node N1 is set low. In this state, when the writing transistor 111 is turned off, a capacitance of the capacitor formed between the gate and the channel of the pass transistor 121 is extremely small because the pass transistor 121 is off. As a result, the potential of the node N1 might not be kept for required time. In addition, when the capacitance of the capacitor 131 is extremely small, the possibility that the potential of the node N1 cannot be kept for required time is increased. In such a case, the potential of the node N1 can be kept low by keeping the potential of the data input terminal D low.

The above operation for setting the potential of the node N1 to a required value and turning on or off the pass transistor 121 is referred to as configuration. A state where this configuration operation can be performed is referred to as a configuration mode. Data for setting the potential of the node N1 is referred to as configuration data.

In the case where, for example, the off-state resistance of the writing transistor 111 is $1\times10^{22}\Omega$, the capacitance of the capacitor 131 is 10 fF, and the gate capacitance of the pass transistor 121 is 0.1 fF, change in the potential of the node N1 is mostly caused by the off-state resistance of the writing transistor 111 and the capacitance of the capacitor 131. A time constant in that case is approximately 1,000 days; thus, about 90% of electric charge stored in the capacitor 131 is held after a lapse of 100 days.

In a signal processing device including the programmable switch 100, arithmetic operation is performed normally when the writing transistor 111 is off, which is referred to as a user mode. In this state, the node N1 is floating and capacitively coupled with the source or the drain and the channel of the pass transistor 121. Accordingly, a change in the potential of the source or the drain of the pass transistor 121 affects and changes the potential of the node N1.

In other words, in the case where a difference between the potential of the node N1 and the potential of the source of the pass transistor 121 is higher than the threshold of the pass transistor 121, the pass transistor 121 is on. Further, due to the capacitive coupling, an increase in the potential of the source or the drain causes an increase in potential of the gate, whereby the potential of the node N1 is increased. This effect is referred to as a boosting effect. In general, as the capacitance of the capacitor between the gate and the channel (or the source or the drain) of the pass transistor 121 is larger and another capacitance (e.g., the capacitance of the capacitor 131) that is loaded on the node N1 is smaller, this effect is larger.

For example, in the case where the boosting effect is not obtained at all, when a potential equal to the potential of the gate is applied to the drain of the pass transistor 121, the potential of the source is lower than that of the drain by the threshold of the pass transistor 121 (the potential of the drain>the potential of the source). However, if the potential of the node N1 is higher than the sum of the potential of the drain and the threshold of the pass transistor 121, the potential of the source can be equal to the potential of the drain.

This effect does not occur in a signal processing device in which an SRAM cell is connected to a gate of a pass transistor to supply a constant voltage. If the potential of the gate of the pass transistor is not enough, the potential of a source is decreased to lower than that of a drain, as described above. In order to avoid this, the potential of the gate of the pass transistor needs to be set high enough in advance.

The boosting effect is unlikely to occur also when the capacitance of the capacitor 131 is much larger than the gate capacitance of the pass transistor 121, as described above. In the above example, the capacitance of the capacitor 131 is 100 times the gate capacitance of the pass transistor 121; thus, the potential of the gate changes only about 1% of the fluctuation range of the potential of the source or the drain of the pass transistor 121. Therefore, also in this case, the potential of the gate of the pass transistor 121 needs to be set high enough in advance.

In order to enhance the boosting effect, the capacitance of the capacitor 131 needs to be substantially equal to or smaller than the gate capacitance of the pass transistor 121. For example, if the capacitance of the capacitor 131 is 0.1 fF, the gate capacitance of the pass transistor 121 is also 0.1 fF; accordingly, the potential of the gate is changed as high as about 50% of the fluctuation range of the potential of the source or the drain of the pass transistor 121. However, in this case where the capacitance of the capacitor 131 is 0.1 fF, the charge retention characteristics of the capacitor 131 degrade and about 60% of the held charge is lost in 20 days.

As described above, the programmable switch 100 has the following trade-off. When the capacitance of the capacitor 131 is large, the charge retention characteristics are favorable, but the boosting effect is small; thus, it is necessary to supply a high potential to the gate of the capacitor 131. On the other hand, when the capacitance of the capacitor 131 is small, the boosting effect becomes larger, but the charge retention characteristics degrade.

A programmable switch 101 in FIG. 1B solves this trade-off. In the programmable switch 101, two writing transistors (the writing transistor 111 and a writing transistor 141) are connected in series, and the capacitor 131 is connected to a node N2 to which these writing transistors are connected.

When the writing transistors 111 and 141 are designed to operate in conjunction with each other as illustrated in FIG. 1B, the circuit configuration is simple. The writing transistors can be designed to operate independently. In addition, to avoid loss of charge due to junction leakage, transistors whose channel is formed in a thin semiconductor layer are preferably used as the writing transistors 111 and 141. A backgate may be provided to one of the writing transistors 111 and 141 to control the threshold of the writing transistor 111 or 141.

The gate (the node N1) of the pass transistor 121 is connected to one of a source and a drain of the writing transistor 141 and one electrode of the capacitor 130. Note that the capacitor 130 includes capacitance that is generated not only intentionally but also unintentionally (parasitic capacitance). Here, the other electrode of the capacitor 130 is connected to a capacitor potential supply terminal E2. Note that as the capacitance of the capacitor 130 is smaller, the boosting effect becomes larger; thus, it is better not to intentionally form capacitance. Here, the capacitance of the capacitor 130 is smaller enough than that of the capacitor 131, that is, smaller than 0.1 times that of the capacitor 131.

Figure 2A:
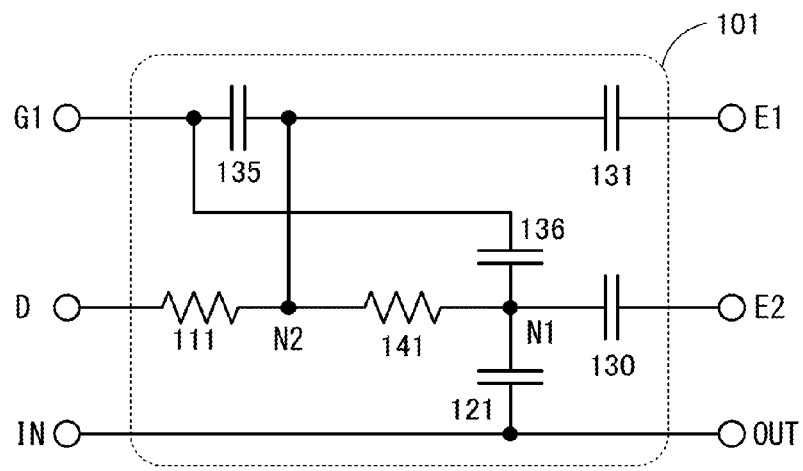
FIGS. 2A and 2B illustrate an operation example and an example of an equivalent circuit of a signal processing device.

An equivalent circuit of the programmable switch 101 is shown in FIG. 2A. FIG. 2A shows the programmable switch 101 in the user mode when the potential of the node N1 is set so that the pass transistor 121 is turned on, in which case the writing transistor 111 has extremely high resistance.

Because the potential of the node N1 is a potential at which the pass transistor 121 is turned on, the gate capacitance of the pass transistor 121 exists between the node N1 and a node IN (and a node OUT). Here, the gate capacitance of the pass transistor 121 is substantially equal to the capacitance of the capacitor 130, that is, larger than or equal to 0.3 times and smaller than or equal to 3 times the capacitance of the capacitor 130. Note that as the gate capacitance of the pass transistor 121 is larger with respect to the capacitance of the capacitor 130, the boosting effect becomes larger as described above, and the gate capacitance is not limited to the above range.

Note that there are a parasitic capacitance 135 and a parasitic capacitance 136 between the node N2 and the writing control terminal G1 and between the node N1 and the writing control terminal G1, respectively. It is preferable that these parasitic capacitances be as small as possible. This is because the parasitic capacitances 135 and 136 cause a decrease in the potential of the node N2 and the potential of the node N1, respectively, when the writing transistors 111 and 141 are turned off in the configuration mode.

When the potential of the data input terminal D and the potential of the node N2 are different, the potential of the node N2 is changed, and the effective degree of the change is determined depending on the off-state resistance of the writing transistor 111 and the capacitance of the capacitor 131. For example, when the off-state resistance of the writing transistor 111 is $1 \times 10^{22} \Omega$ and the capacitance of the capacitor 131 is 10 fF, the time constant is approximately 1,000 days. A period in the following description is shorter enough than 1,000 days; thus, the potential of the node N2 is not affected by the potential of the data input terminal D. Although the potential of the node N2 is affected by charge moving from the node N1, change in the potential can be ignored for the following reason. In other words, the potential of the node N2 can be assumed to be constant.

The off-state resistance of the writing transistor 141 is a finite value. When the potential of the node IN (and the node OUT) is constant and the potential of the node N1 is different from the potential of the node N2, charge stored in the node N1 moves to the node N2, so that the potential of the node N1 is changed. The effective degree of the change is determined depending on the off-state resistance of the writing transistor 141, the capacitance of the capacitor 130, and the gate capacitance of the pass transistor 121. For example, when the off-state resistance of the writing transistor 141 is $1 \times 10^{13} \Omega$ and the sum of the capacitance of the capacitor 130 and the gate capacitance of the pass transistor 121 is 0.1 fF, the time constant is approximately 1 millisecond.

Figure 2B:
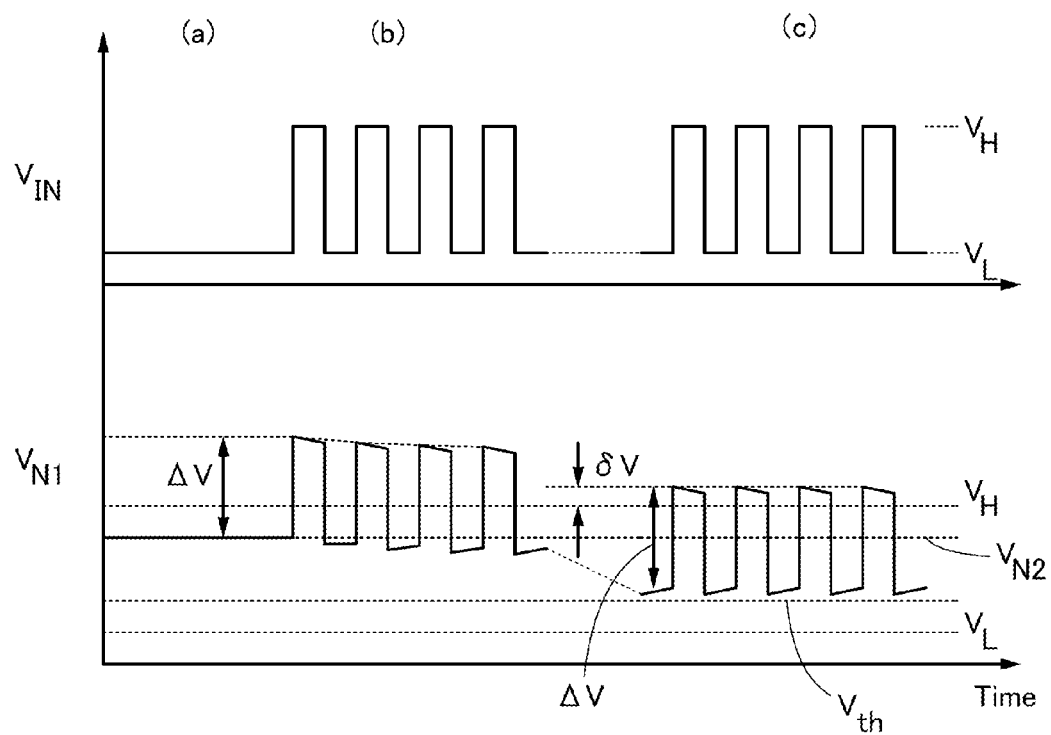

FIG. 2B schematically shows change in the potential $V_{N1}$ of the node N1 when the node IN is configured to be supplied with a signal which cyclically repeats the potential $V_L$ and the potential $V_H$ and has a duty ratio of 0.5.

Assuming that, at first, the potential $V_{IN}$ is kept at $V_L$ and the potential $V_{N1}$ is substantially equal to the potential $V_{N2}$ of the node N2. Note that the potential $V_{N2}$ is assumed to be constant as described above. Further, when a potential input to the data input terminal D is $V_H$, the upper limit of the potential $V_{N2}$ is $V_H$, but is assumed to be lower than the potential $V_H$ here. The potential $V_{N2}$ becomes lower than $V_H$ by the above effect of the parasitic capacitance 135 and the like, which occurs in general.

After that, the potential $V_{IN}$ starts to change as described above. The potential $V_{N1}$ also changes in accordance with the change of the potential $V_{IN}$. When the potential $V_{IN}$ is increased to $V_H$, the potential $V_{N1}$ is increased to higher than the potential $V_{N2}$ by a potential difference $\Delta V$ due to the boosting effect. Thus, positive charge moves from the node N1 to the node N2 through the writing transistor 141, whereby the potential $V_{N1}$ is decreased.

Note that the potential $V_{N1}$ is only slightly decreased. This is because a time constant which is determined by the off-state resistance of the writing transistor 141, the capacitance of the capacitor 130, and the gate capacitance of the pass transistor 121 is larger enough than that in a period during which the potential $V_{IN}$ is $V_H$ (a period during which a pulse continues).

Although the potential $V_{N2}$ is increased because positive charge in the node N2 is increased, this potential change is considered non-existent because the capacitance of the capacitor 131 is larger enough than the capacitance of the capacitor 130. In other words, the potential of the node N1 does not influence the circuits past the writing transistor 141 (e.g., the capacitor 131) and thus there is no need to consider influence on those circuits.

The potential difference $\Delta V$ shows the magnitude of boosting effect, which is obtained by multiplying the ratio of a capacitance between the node N1 and the node IN (and the node OUT) (which is regarded substantially as the gate capacitance of the pass transistor 121) to total capacitance involved in the node N1 (which is regarded substantially as the sum of the gate capacitance of the pass transistor 121 and the capacitance of the capacitor 130) by the fluctuation range of the potential of the node IN.

Next, when the potential $V_{IN}$ is decreased to $V_L$, the potential $V_{N1}$ is decreased by the potential difference $\Delta V$ due to the reverse action of the boosting effect (reverse boosting effect). The potential $V_{N1}$ is slightly lower than a potential $(V_{N2}+\Delta V)$ when the reverse boosting effect starts; thus, the potential $V_{N1}$ is decreased to lower than the potential $V_{N2}$. Accordingly, positive charge moves from the node N2 to the node N1 through the writing transistor 141, so that the potential $V_{N1}$ is slightly increased. However, a difference between the potentials $V_{N1}$ and $V_{N2}$ at this point is extremely small; thus, there is little charge movement and an increase of the potential $V_{N1}$ is also extremely limited.

In this manner, the potential $V_{N1}$ repeats increase and decrease in accordance with the change of the potential $V_{IN}$. A maximum value of $V_{N1}$ is marked shortly after the potential $V_{IN}$ becomes $V_H$, and a minimum value is marked shortly after the potential $V_{IN}$ becomes $V_L$. Note that each of the maximum value and the minimum value is gradually decreased. As the maximum value is decreased, the gap between the maximum value and $V_{N2}$ is gradually closed and the amount of positive charge moving from the node N1 to the node N2 is reduced. As the minimum value is decreased, the gap between the minimum value and $V_{N2}$ is gradually widened and the amount of positive charge transferring from the node N2 to the node N1 is increased. Finally, the maximum value and the minimum value converge at certain values.

For example, when the duty ratio is 0.5 as described above, the average of the maximum value and the minimum value is $V_{N2}$, and (the maximum value—$V_{N2}$) is equal to ($V_{N2}$—the minimum value), an equal amount of positive charge which moves from the node N1 to the node N2 after the maximum value is marked returns from the node N2 to the node N1 after the minimum value is marked. Thus, no effective charge movement from the node N1 is regarded to occur in this cycle.

Each convergence value of the maximum value and the minimum value depends on the duty ratio. As the proportion of a period during which the potential $V_{IN}$ is $V_H$ is decreased, the convergence values are increased. In practical usage of a signal processing device, a regular pulse is not applied all the time. Thus, the duty ratio may be smaller than 0.5.

Here, there are two important points. One is that a value obtained by subtracting $V_L$ from the converged minimum value is higher than the threshold $V_{th}$ of the pass transistor 121. If the value obtained by the subtraction is lower than the threshold $V_{th}$, the pass transistor 121 is turned off and the boosting effect is not produced, so that the pass transistor 121 responses little to the potential fluctuation of the node IN.

The other is that a value δV which is obtained by subtracting $V_H$ from the converged maximum value is higher than the threshold $V_{th}$ of the pass transistor 121. If δV is higher than the threshold $V_{th}$, the potential of the node OUT becomes $V_H$ when $V_{IN}$ is $V_H$. Conversely, if δV is lower than the threshold $V_{th}$, the potential of the node OUT becomes ($V_H$+δV–$V_{th}$) (<$V_H$) when $V_{IN}$ is $V_H$.

Although the off-state resistance of the writing transistor 141 is $1\times10^{13}\Omega$ in the above description, it may have an extremely large value ($1\times10^{19}\Omega$ or larger) as in the writing transistor 111. In that case, the time constant is longer than several tens of minutes and thus the above description can be ignored substantially.

Although the writing transistor 141 is a high resistance in the user mode in the above description, a resistor 140 can be used instead of the writing transistor 141 as in a programmable switch 101a in FIG. 1C. As the resistor 140, an element utilizing Schottky junction can be employed. Note that an element having a rectifying function such as a diode is not preferable. An element whose structure is a transistor but whose gate is always supplied with bias to be turned off can be used.

In the user mode, a time constant that is determined by the resistance of the resistor 140 and the capacitance of the capacitor 130 may be larger enough than a width of a pulse applied to the node IN (or the node OUT). Note that in the configuration mode, if the time constant is too large, writing is hampered.

For example, if the time constant that is determined by the resistance of the resistor 140 and the capacitance of the capacitor 130 is 1 millisecond, there is no need to consider circuits past the resistor 140 when a pulse which is applied to the node IN has a width of 10 microseconds or less. When writing, it takes at least several milliseconds before charge moves from the node N2 to the node N1 and a potential reaches a predetermined potential. In other words, it is necessary to wait for several milliseconds until transition from the configuration mode to the user mode is completed.

However, this does not mean that it takes several tens of milliseconds to set 10 programmable switches 101a in order. It takes only several milliseconds to set 10 programmable switches 101a in order.

For example, it takes only several times as long as a time constant obtained by the capacitance of the capacitor 131 and the on-state resistance of the writing transistor 111 to set the potential of the node N2 of one of the programmable switches 101a at a predetermined value (or a value close to the predetermined value). Thus, even when the on-state resistance of the writing transistor 111 is $1\times10^9\Omega$, which is relatively high, several tens of microseconds are enough. It takes about 1 millisecond to set 10 programmable switches 101a in order.

Then, after a lapse of several milliseconds, the positive or negative charge stored in the node N2 moves to the node N1 through the resistor 140. Strictly speaking, the potential of the node N2 becomes different from the potential originally set because the amount of charge stored in the node N2 is reduced. However, because the capacitance of the capacitor 131 is larger enough than the capacitance of the capacitor 130 and the gate capacitance of the transistor 121, the potential change in the node N2 is as small as negligible. Further, the potential of the node N1 becomes almost equal to the potential of the node N2.

In general, in terms of the structure, a parasitic capacitance of a resistor is unlikely to be generated comparing to a transistor. Thus, the capacitance of the capacitor 130 can be small, which is effective in enhancing the boosting effect.

Note that the description "the potential of the node N1 substantially becomes a potential corresponding to configuration data not when the programmable switches 101a are set (when the configuration data is written to the programmable switches 101a), but some time after the programmable switches 101a are set" means that regardless of the potentials of the nodes of the source and the drain of the pass transistor 121 at the time when configuration data is written, the boosting effect can be obtained by setting the potentials to $V_L$ after the writing.

For example, as described above, assuming that it takes 1 millisecond to complete the input of configuration data to 10 programmable switches 101a in order, and that the potential of the node N2 of each of the programmable switches 101a becomes $V_H$ at that time. The potential of the node N1 is assumed to have some value to turn on the pass transistor 121.

After that, when the potential of the node IN or the node OUT changes from $V_H$ to $V_L$, the potential of the node N1 is decreased to a potential lower than the potential $V_H$ by the reverse boosting effect. Accordingly, positive charge moves from the node N2 with higher potential to the node N1 with lower potential, so that the potential of the node N1 is increased again and becomes almost equal to the potential of the node N2 after a lapse of several milliseconds. Although positive charge moves to the node N1, the potential change of the node N2 can be ignored because the capacitance of the capacitor 131 is much larger than the capacitance of the capacitor 130. In this state, when the potential of the node IN or the node OUT changes from $V_L$ to $V_H$, the potential of the node N1 is also increased by the boosting effect.

Figure 3A:
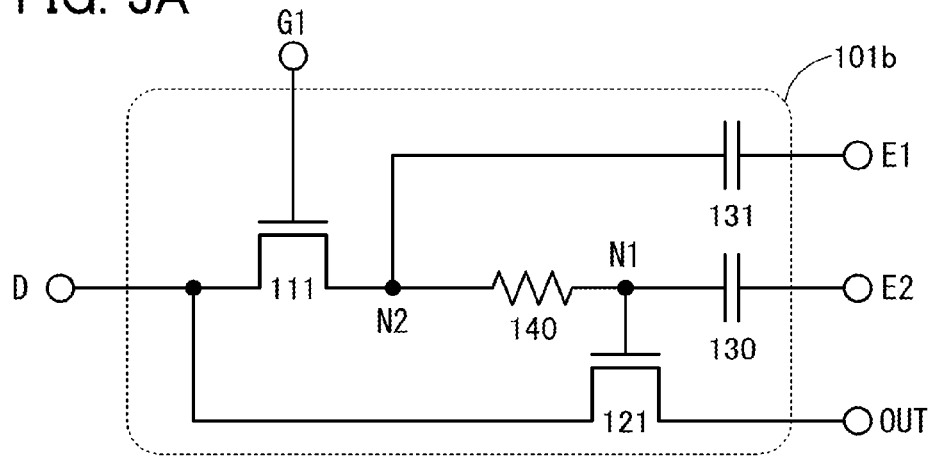
FIGS. 3A to 3C illustrate an operation example and examples of a circuit of a signal processing device.

By applying this principle, the number of wirings can be reduced by connecting the data input terminal D to the node IN in FIG. 1C. An example of this circuit is shown in FIG. 3A. In a programmable switch 101b, when the potential of the data input terminal D is $V_H$, the potential of one on the data input terminal D side of the source and the drain of the pass transistor 121 also becomes $V_H$.

In the programmable switch 100 in FIG. 1A, assuming that the potential of the node OUT is constant at $V_L$. Both potentials of the data input terminal D and the node IN are set at $V_H$ and the writing transistor 111 is turned on. Then, the potential of the node N1 immediately changes to $V_H$ to turn on the pass transistor 121. As a result, current flows between the node IN and the node OUT. Next, the writing transistor 111 is turned off and the potential of the data input terminal D and the potential of the node IN are changed to $V_L$, so that the potential of the source or the drain of the pass transistor 121 is also decreased. As a result, the potential of the node N1 becomes lower than the potential originally set.

In the programmable switch 100 in FIG. 1A, in the case where the capacitance of the capacitor 131 gets small to enhance the boosting effect, a decrease in the potential of the node N1 is significant. When the potential of the node IN (the data input terminal D) is changed to $V_H$ in the user mode after that, the potential of the node N1 cannot exceed $V_H$.

At first, in the programmable switch 101b in FIG. 3A, the potential of the data input terminal D is set at $V_H$ to write configuration data. This will cause the potential of the source or the drain of the pass transistor 121 is also changed to $V_H$. Then the writing transistor 111 is turned on. Thus, the potential of the node N2 is changed to $V_H$. However, the potential of the node N1 is not changed to $V_H$ immediately. This is because the resistance of the resistor 140 is too large. Then the writing transistor 111 is turned off. After that, the potential of the data input terminal D is set at $V_L$. In this case, enough time has elapsed, the potential of the node N1 is increased to a value approximately equal to the potential of the node N2 (i.e., approximately $V_H$). Before that, the pass transistor 121 remains off and current does not flow between the data input terminal D and the node OUT. If the potential of each of the data input terminal D and the node OUT are $V_L$ when the potential of the node N1 becomes approximately $V_H$, enough boosting effect can be obtained. As a result, in the user mode after that, when the potential of the node IN (the data input terminal D) is changed to $V_H$, the potential of the node N1 can exceed $V_H$.

Figure 3B:
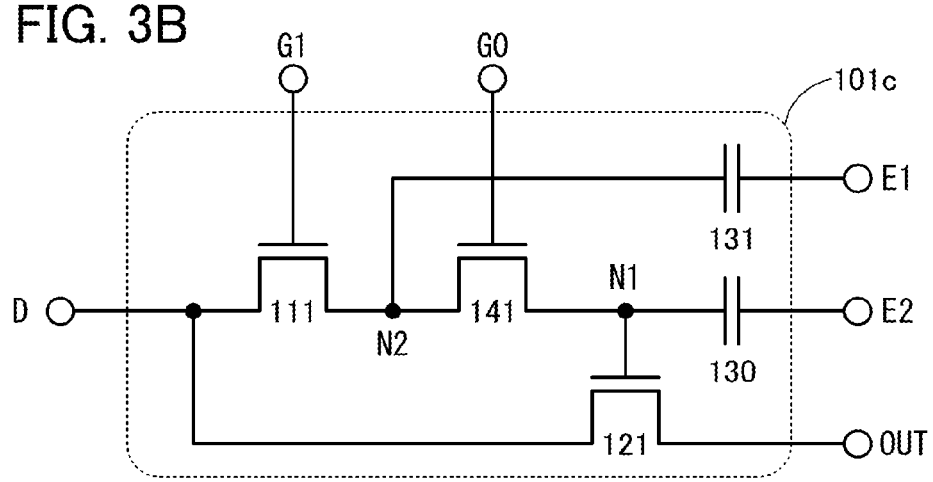

This effect can be achieved also in the programmable switch 101 in FIG. 1B, when the off-state resistance of the writing transistor 141 has an appropriate value as described above. Note that in the case where the off-state resistance of the writing transistor 141 is extremely high, it is preferable to control conduction of the writing transistor 141 independently of the writing transistor 111 as in the programmable switch 101c in FIG. 3B.

Figure 3C:
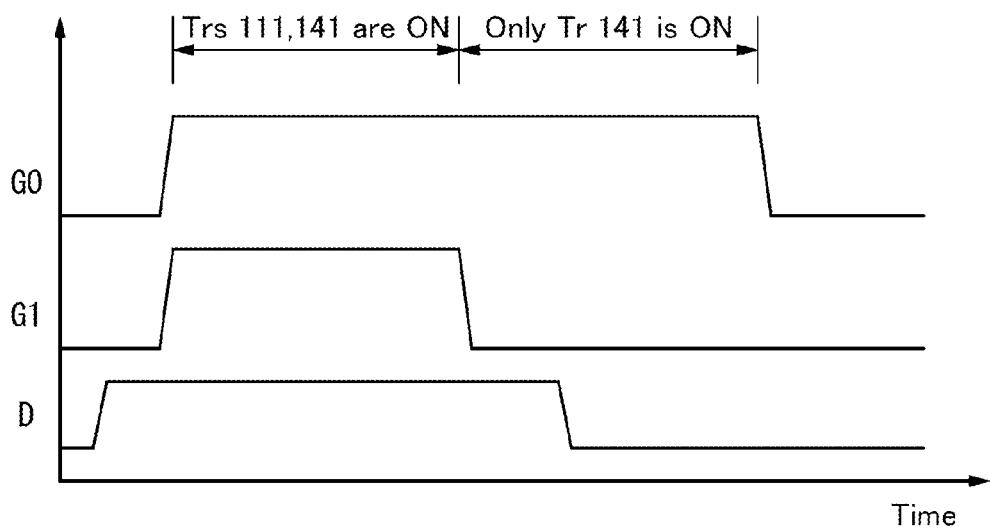

For example, the potentials of a writing control terminal G0 and the writing control terminal G1 are determined to provide a period during which only the writing transistor 141 is on and a period during which the writing transistors 111 and 141 are on, as shown in FIG. 3C. Further, the potential of the data input terminal D needs to become low before the end of the period during which only the writing transistor 141 is on.

Note that in an ordinary programmable logic device, a node OUT is terminated with a capacitor electrode such as a gate of a transistor. In this case, it can be assumed that no constant current flows between a node IN and the node OUT, regardless of the value of the potential of the node IN.

Figure 4:
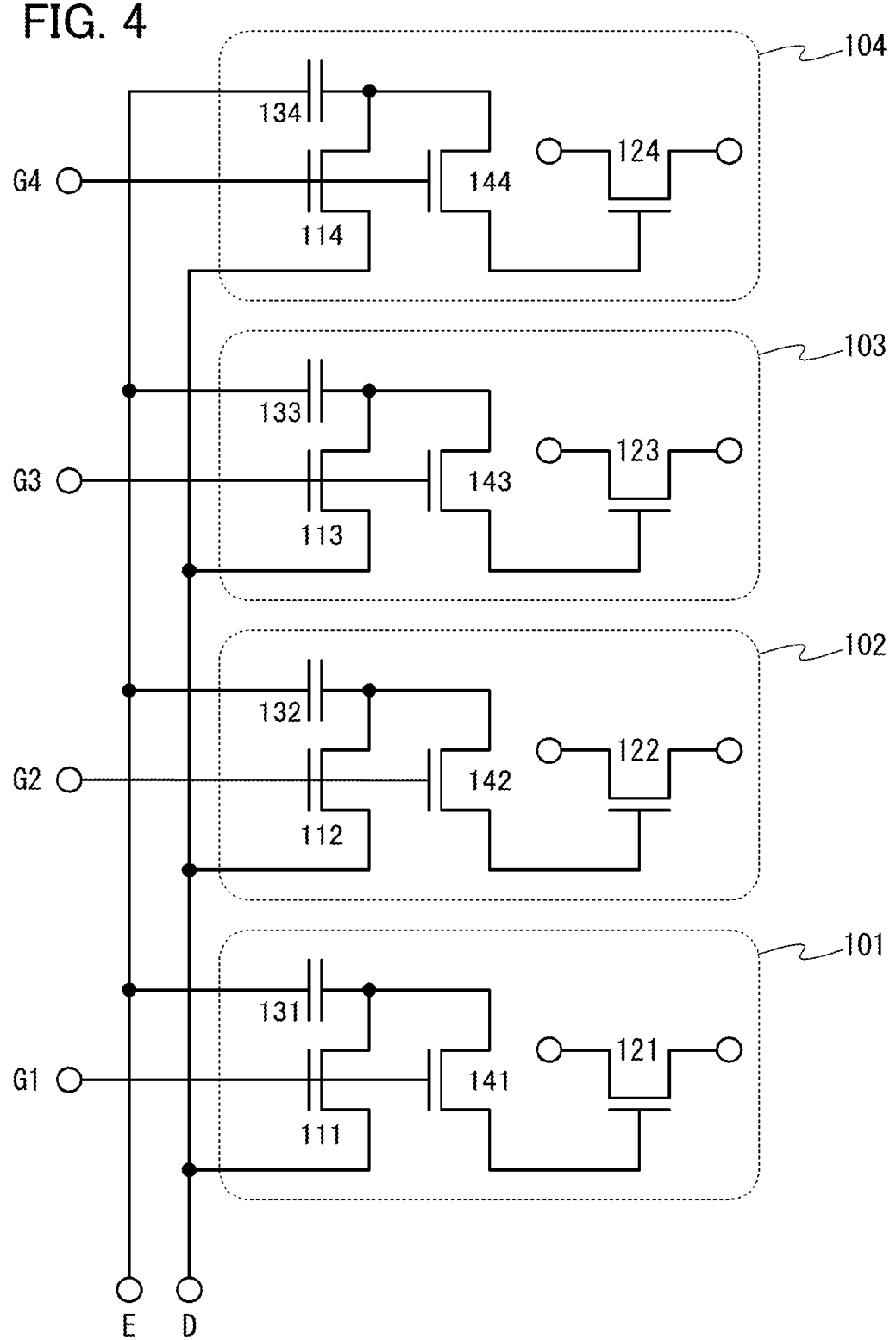
FIG. 4 illustrates an example of a circuit of a signal processing device.

A plurality of programmable switches as described above is included in a programmable logic device. FIG. 4 shows an example of the programmable logic device. Part of the programmable logic device is illustrated in FIG. 4. Note that a capacitor corresponding to the capacitor 130 is omitted because the capacitance of the capacitor is extremely small.

In each of the writing transistors 111 to 114 of the programmable switches 101 to 104, one of a source and a drain which is not connected to a writing transistor (141, 142, 143, or 144) is connected to the data input terminal D. In each of the writing transistors 111 to 114, the other of the source and the drain which is connected to the writing transistor (141, 142, 143, or 144) is connected to a capacitor (131, 132, 133, or 134). In each of the transistors 141 to 144, one of a source and a drain which is not connected to the writing transistor (111, 112, 113, or 114) is connected to a gate of a pass transistor (121, 122, 123, or 124).

In the configuration mode, while the conduction of the writing transistors 111 to 114 and 141 to 144 is controlled by the potentials of writing control terminals G1 to G4, data input to the programmable switches 101 to 104 is applied to the data input terminal D; thus, a potential of the gate of each of the pass transistors 121 to 124 can be controlled.

Figure 5:
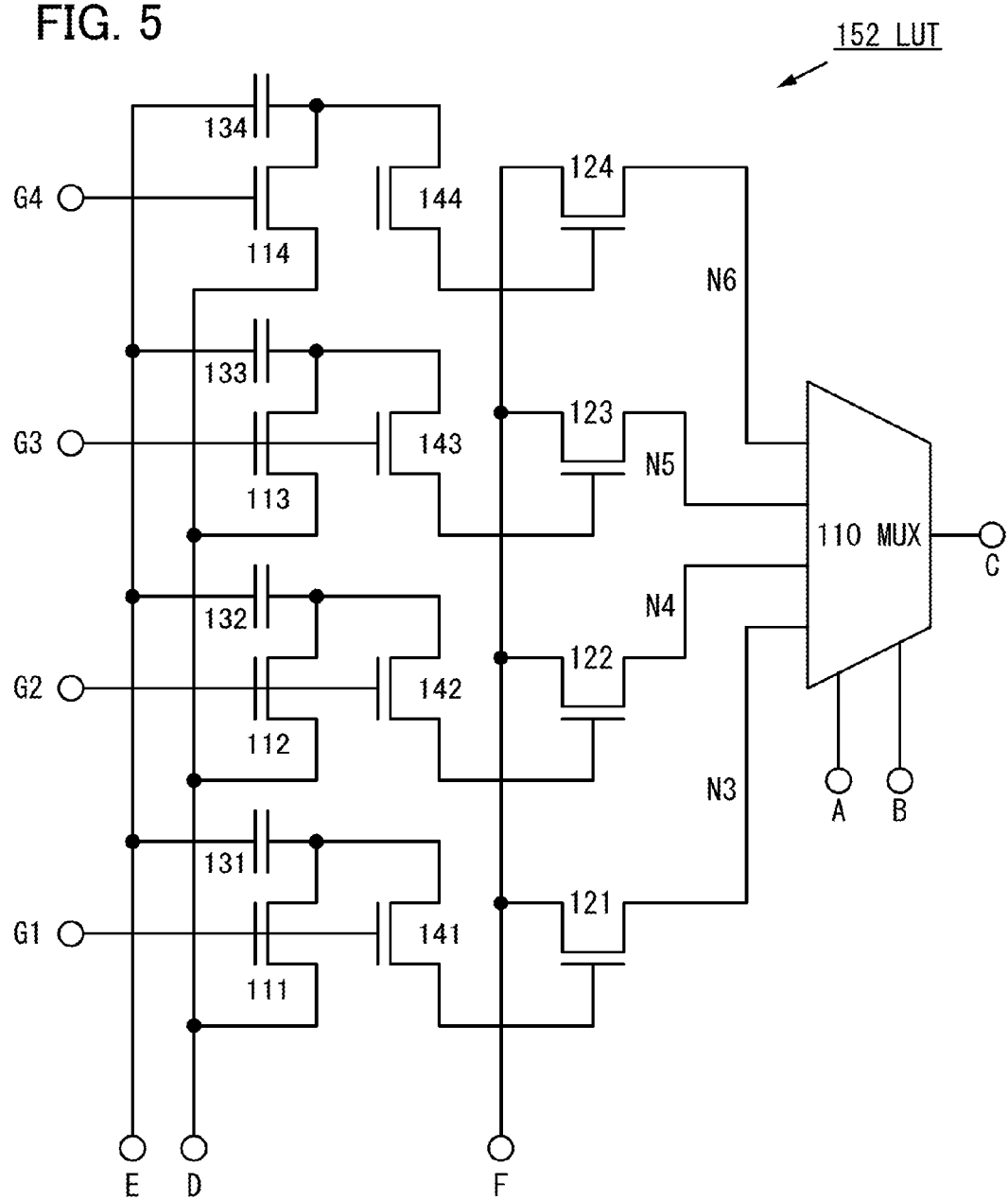
FIG. 5 illustrates an example of a circuit of a signal processing device.

FIG. 5 is an application example of the circuit in FIG. 4, which illustrates a lookup table 152. In FIG. 4, portions to which the source and the drain of each of the pass transistors 121 to 124 are connected are not shown, whereas in the lookup table 152, one of the source and the drain (nodes N3 to N6) of each of the pass transistors 121 to 124 is connected to an input terminal of a multiplexer 110, and the other is connected to a signal input terminal F.

Any one of the nodes N3 to N6 is connected to an output terminal C in accordance with signals input to a selection control terminal A and a selection control terminal B. In other words, any one of the four pass transistors 121 to 124 is selected.

A method for inputting data to the lookup table 152 in the configuration mode is similar to that described in FIG. 1A. Note that it is preferable that the potential of each of the signal input terminal F and the nodes N3 to N6 be low.

In the user mode, signals are input to the selection control terminals A and B. According to combination of the signals, a high potential or a low potential is output from the output terminal C. Also at this time, both potential of the output terminal C and the signal input terminal F are set low at first, and then, the output terminal C is in a floating state and the potential of the signal input terminal F is high.

When the potential of a gate of a pass transistor which is selected in accordance with combination of the selection control terminals A and B is high, the potential of the output terminal C is increased, whereas when the potential is low, the potential is little changed.

Even if the potential of the signal input terminal F is changed to high in the state where the potential of the gate of the pass transistor is fixed at high, the boosting effect cannot be obtained. Thus, a potential lower by the threshold value of the pass transistor from such high potential is output from the pass transistor.

On the other hand, in the lookup table 152 in FIG. 5, each gate of the pass transistors 121 to 124 is floating; thus, the potential of each gate is changed in accordance with the potential of the source or the drain.

For example, in the configuration mode, both the source and the drain of the pass transistors 121 to 124 are set to low and each gate is set to high, and then, each gate becomes floating. Then, at the stage of changing the potential of the signal input terminal F to high in the user mode, the potential of each gate of the pass transistors is changed to higher than the high potential by the boosting effect. As a result, the potential output from the pass transistors is higher than that of the pass transistors whose gates are fixed at the high potential, or becomes the high potential in some cases. Further, when the potential of each gate of the pass transistors becomes higher than the high potential, the on-state resistance of the pass transistors is decreased.

In the programmable logic device shown in FIG. 4, data of any programmable switch can be rewritten; however, contacts for connecting the programmable switches 101 to 104 and the data input terminal D need to be provided.

Figure 6:
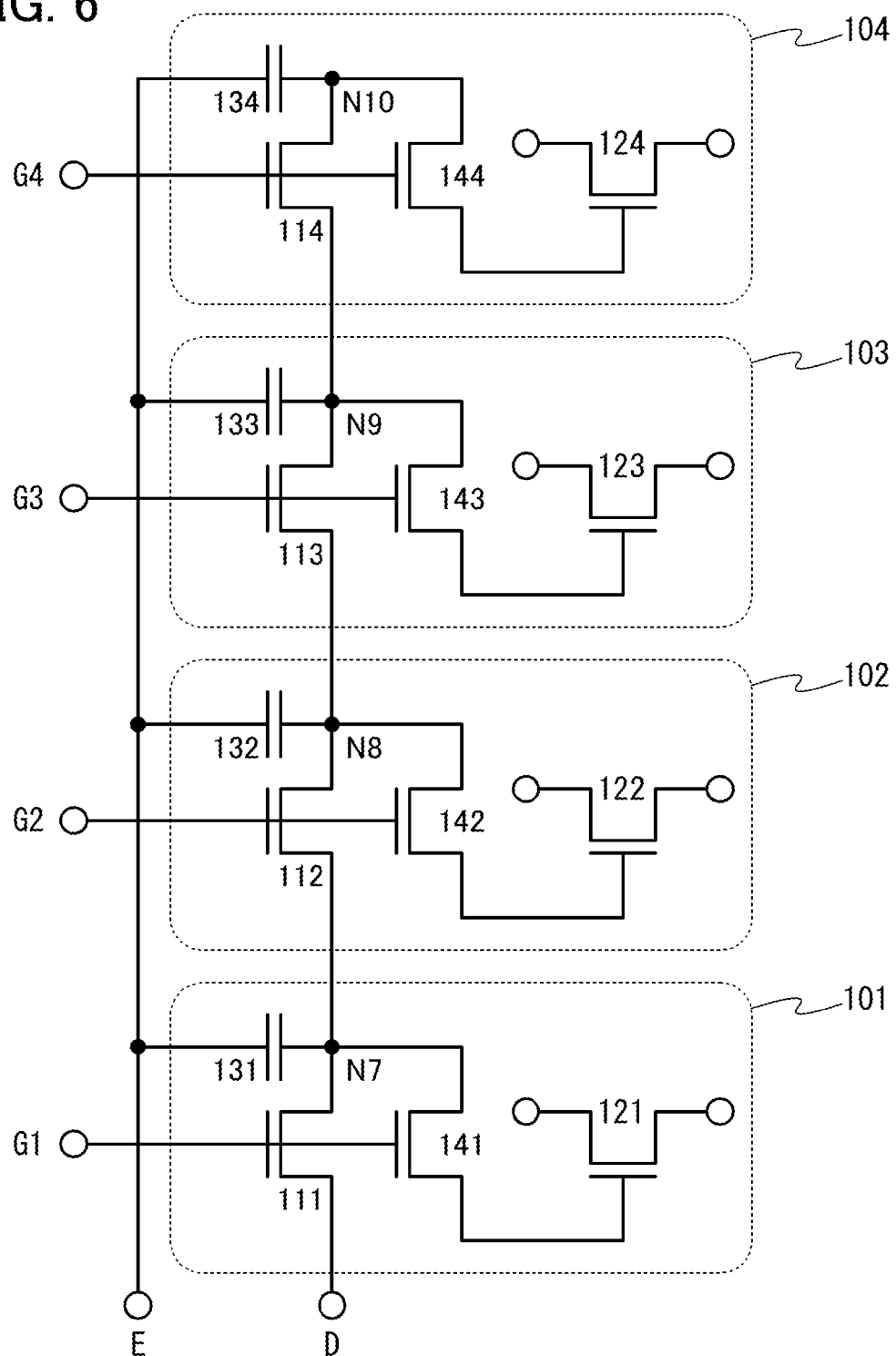
FIG. 6 illustrates an example of a circuit of a signal processing device.

FIG. 6 shows another example of a circuit including a plurality of programmable switches. FIG. 6 shows part of a programmable logic device. This example also includes four programmable switches (the programmable switches 101 to 104). Here, the writing transistors 111 to 114 of the programmable switches are connected in series. Thus, the contacts for connecting the programmable switches 101 to 104 and the data input terminal D do not need to be provided for the programmable switches 101 to 104.

Therefore, the circuit configuration can be simplified. Further, because the number of contacts can be reduced, contact defects are reduced and yield is improved. Furthermore, because the number of contacts is reduced, high integration can be achieved.

One of a source and a drain of the writing transistor 111 is connected to the data input terminal D. One of a source and a drain of the writing transistor 114 (a node N10) is connected to the gate of the pass transistor 124 through the writing transistor 144.

A node N7 at which the writing transistor 111 is connected to the writing transistor 112 is connected to a gate of the pass transistor 121 through the writing transistor 141. A node N8 at which the writing transistor 112 is connected to the writing transistor 113 is connected to a gate of the pass transistor 122 through the writing transistor 142. A node N9 at which the writing transistor 113 is connected to the writing transistor 114 is connected to a gate of the pass transistor 123 through the writing transistor 143.

A method for writing data to the circuit having the above connection structure will be described. Writing of data needs to be performed sequentially. That is, when writing or rewriting of data is needed in any of the programmable switches, writing or rewriting of data needs to be performed not only in that programmable switch, but also in a programmable switch provided between the data input terminal D and that programmable switch.

For example, in the case where data of only the programmable switch 103 is changed among the programmable switches 101 to 104, data is written to the programmable switch 103, then, the same data as the data written in the programmable switch 102 is also written, and then, the same data as the data written in the programmable switch 101 is also written.

Specifically, data written to the programmable switch 103 is input to the data input terminal D in the state where the writing transistors 111 to 113 are on and the writing transistor 114 is off. Then, data written to the programmable switch 102 (data that has been written) is input to the data input terminal D in the state where the writing transistors 113 and 114 are off and the writing transistors 111 and 112 are on. Finally, data written to the programmable switch 101 (data that has been written) is input to the data input terminal D in the state where the writing transistors 112 to 114 are off and the writing transistor 111 is on.

In this manner, data of a programmable switch that is not really necessary to be rewritten has to be rewritten in order to rewrite only data of a certain programmable switch; thus, processing takes a long time. On the other hand, in the case where data of all the programmable switches 101 to 104 are rewritten, for example, the rewriting can be carried out at about the same speed as the circuit in FIG. 4.

In a programmable logic device, data of a programmable switch is less likely to be rewritten randomly, and rewriting is often carried out for each large block or for the entire device. Thus, even the circuit configuration in FIG. 6 and the above-described method for writing data do not cause many problems.

Figure 7:
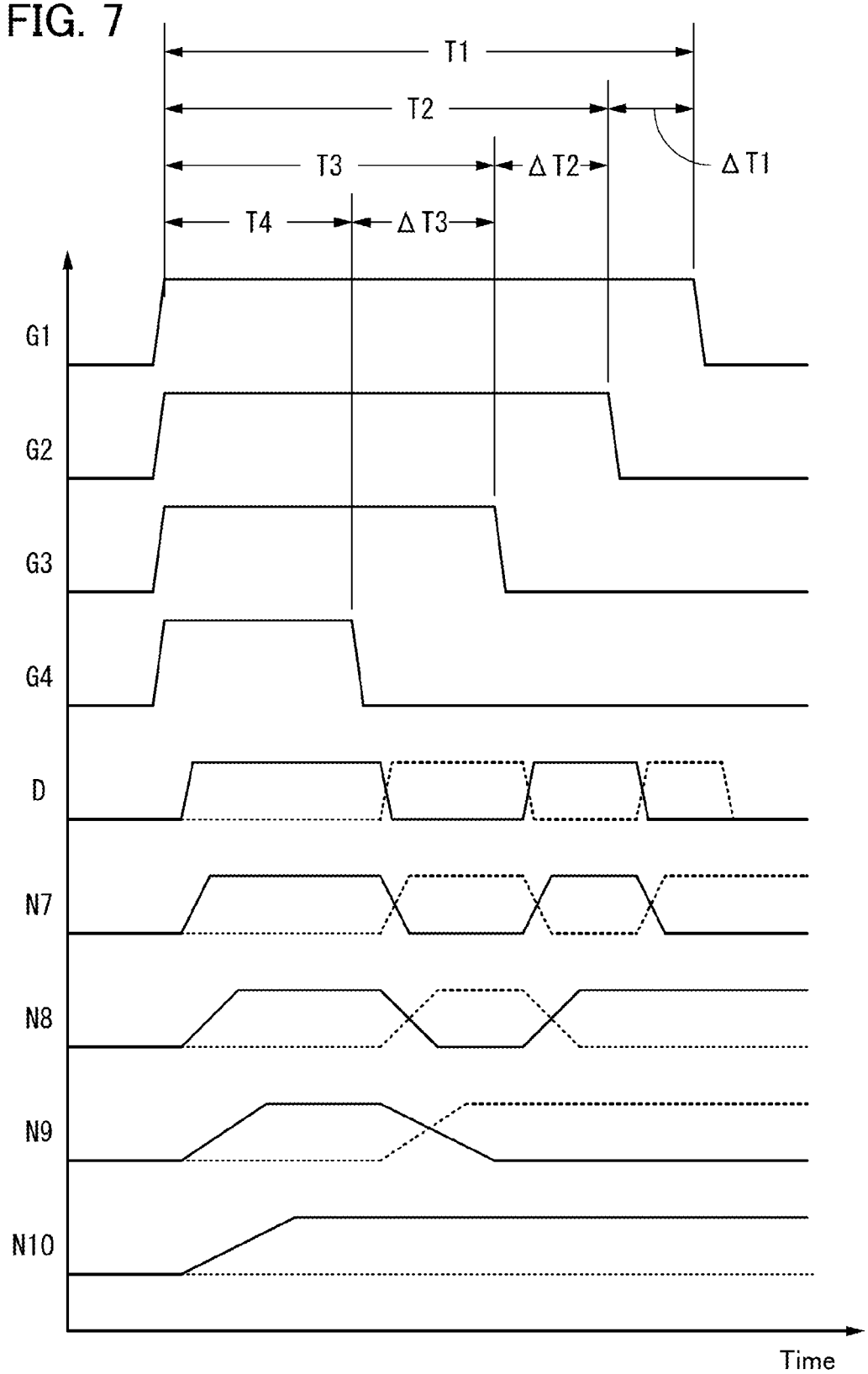
FIG. 7 illustrates an operation example of a signal processing device.

The case of rewriting data of all the programmable switches 101 to 104 in the circuit in FIG. 6 is described with reference to FIG. 7. FIG. 7 shows two cases of potentials of the nodes N7 to N10: one is that the potentials of the nodes N7 to N10 are low, high, low, and high, respectively (denoted by a solid line), and the other is that the potentials of the nodes N7 to N10 are high, low, high, and low, respectively (denoted by a dotted line).

In either case, widths of pulses applied to the writing control terminals G1 to G4 are T1, T2, T3, and T4, respectively. In this example, the pulses applied to the writing control terminals G1 to G4 start at about the same time and end at different times. The pulse applied to the control terminal G4 is the shortest. The pulse applied to the control terminal G1 is the longest.

Here, in a period during which pulses applied to the writing control terminal G1 to G4 overlap, the corresponding writing transistors are in an on state at the same time.

A difference between a period T1 and a period T2 ($\Delta$T1), a difference between the period T2 and a period T3 ($\Delta$T2), and a difference between the period T3 and a period T4 ($\Delta$T3) may be all the same or different. For example, $\Delta$T1<$\Delta$T2<$\Delta$T3<T4 is possible. In the periods $\Delta$T1, $\Delta$T2, $\Delta$T3, and T4, writing of data is allowed to the programmable switches 101, 102, 103, and 104, respectively.

As a programmable switch is farther from the data input terminal D, signal delay is increased and data writing takes longer time. Thus, T4 needs to be long enough. On the other hand, in a programmable switch close to the data input terminal D, signal delay is small and data is written in a short time. Thus, $\Delta$T1 may be short. In this manner, $\Delta$T1, $\Delta$T2, $\Delta$T3, and T4 are set in accordance with signal delay, so that data can be written in all the programmable switches in a shorter time.

The resistor 140 shown in FIG. 1C can be used instead of the writing transistors 141 to 144 in FIGS. 4 to 6. The circuits shown in FIGS. 1A to 1C, FIGS. 2A and 2B, FIGS. 3A to 3C, FIG. 4, and FIG. 5 can be combined.

Next, an oxide semiconductor that can be used for the writing transistor 111 and the like will described.

The oxide semiconductor contains, for example, indium. An oxide semiconductor containing indium has high carrier mobility (electron mobility). An oxide semiconductor preferably contains an element M. The element M is aluminum, gallium, yttrium, or tin, for example. The element M is an element having a high bonding energy with oxygen, for example. The element M increases the energy gap of the oxide semiconductor, for example. Further, the oxide semiconductor preferably contains zinc. When containing zinc, the oxide semiconductor is likely to be crystalline. The energy at the top of the valence band (Ev) of the oxide semiconductor can be controlled by, for example, the atomic ratio of zinc, in some cases.

The oxide semiconductor does not necessarily contain indium. The oxide semiconductor may be, for example, Zn—Sn oxide or Ga—Sn oxide.

The oxide semiconductor may be an In-M-Zn oxide having any of the following atomic ratios of In to M: the atomic percentage of In is smaller than 50 atomic % and the atomic percentage of M is larger than or equal to 50 atomic %, and the atomic percentage of In is smaller than 25 atomic % and the atomic percentage of M is larger than or equal to 75 atomic %, when summation of In and M is assumed to be 100 atomic %. Further, the oxide semiconductor may be In-M-Zn oxide having any of the following atomic ratios of In to M when summation of In and M is assumed to be 100 atomic %: the atomic percentage of In is larger than or equal to 25 atomic % and the atomic percentage of M is smaller than 75 atomic %, and the atomic percentage of In is larger than or equal to 34 atomic % and the atomic percentage of M is smaller than 66 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

In order to obtain stable electrical characteristics of a transistor, it is effective to reduce the concentration of impurities in the oxide semiconductor so that the oxide semiconductor is highly purified to be intrinsic. In the oxide semiconductor, a light element, a metalloid element, a metal element, and the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities to the oxide. Accordingly, the concentration of impurities in an adjacent layer is preferably reduced.

For example, in some cases, silicon in an oxide semiconductor forms impurity states. Further, in some cases, silicon at the surface of an oxide semiconductor forms impurity states. The concentration of silicon in an oxide semiconductor or at the surface of an oxide semiconductor measured by secondary ion mass spectrometry (SIMS) is preferably lower than $1 \times 10^{19}$ atoms/cm$^3$, more preferably lower than $5 \times 10^{18}$ atoms/cm$^3$, still more preferably lower than $2 \times 10^{18}$ atoms/cm$^3$.

Further, in some cases, hydrogen in an oxide semiconductor forms impurity states, whereby carrier density is increased. Thus, the concentration of hydrogen in the oxide semiconductor, which is measured by SIMS, can be set to lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. Further, in some cases, nitrogen in an oxide semiconductor forms impurity states, whereby carrier density is increased. Thus, the concentration of nitrogen in the oxide semiconductor, which is measured by SIMS, can be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

An oxide semiconductor may include a non-single-crystal, for example. The non-single-crystal state is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at $2\theta$ of around 31 degrees which shows alignment appears in some cases. Further, for example, spots (luminescent spots) are observed in an electron diffraction pattern of the CAAC-OS in some cases. An electron diffraction pattern obtained with an electron beam having a beam diameter of 10 nmϕ or smaller, or 5 nmϕ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a beam diameter larger than the diameter of a crystal part (for example, a beam diameter of 20 nmφ or more, or 50 nmφ or more). For example, spots are shown in some cases in a nanobeam electron diffraction pattern of the nc-OS obtained by using an electron beam having a beam diameter smaller than or equal to that of a crystal part (for example, a beam diameter of 10 nmφ or less, or 5 nmφ or less). In a nanobeam electron diffraction pattern of the nc-OS, for example, regions with high luminance in a circular pattern are shown in some cases. In a nanobeam electron diffraction image of the nc-OS, for example, a plurality of spots is shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

The oxide semiconductor may be a multilayer film. For example, a multilayer film in which an oxide semiconductor layer (S1) and an oxide semiconductor layer (S2) are formed in this order may be used.

In this case, the conduction band edge (Ec) of the oxide semiconductor layer (S2) is made lower than that of the oxide semiconductor layer (S1), for example. Specifically, for the oxide semiconductor layer S2, an oxide semiconductor having higher electron affinity than the oxide semiconductor layer S1 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

Alternatively, the energy gap of the oxide semiconductor layer (S2) is made smaller than that of the oxide semiconductor layer (S1), for example. The energy gap can be obtained by, for example, an optical method. Specifically, for the oxide semiconductor layer (S2), an oxide semiconductor having smaller energy gap than the oxide semiconductor layer (S1) by greater than or equal to 0.1 eV and smaller than or equal to 1.2 eV or by greater than or equal to 0.2 eV and smaller than or equal to 0.8 eV is used.

Alternatively, the oxide semiconductor may be, for example, a multilayer film in which the oxide semiconductor layer (S1), the oxide semiconductor layer (S2), and an oxide semiconductor layer (S3) are formed in this order.

For example, the energy (Ec) at the bottom of the conduction band of the oxide semiconductor layer (S2) is set to be lower than that of the oxide semiconductor layer (S1) and the oxide semiconductor layer (S3). Specifically, for the oxide semiconductor layer (S2), an oxide semiconductor having higher electron affinity than the oxide semiconductor layers (S1) and (S3) by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used.

Alternatively, for example, the energy gap of the oxide semiconductor layer (S2) may be smaller than that of each of the oxide semiconductor layers (S1) and (S3). Specifically, for the oxide semiconductor layer (S2), an oxide semiconductor having smaller energy gap than the oxide semiconductor layers (S1) and (S3) by greater than or equal to 0.1 eV and smaller than or equal to 1.2 eV or by greater than or equal to 0.2 eV and smaller than or equal to 0.8 eV is used.

To increase the on-state current of the top-gate transistor, for example, the thickness of the oxide semiconductor layer (S3) is preferably as small as possible. For example, the thickness of the oxide semiconductor layer (S3) is less than 10 nm, preferably less than or equal to 5 nm, more preferably less than or equal to 3 nm. In contrast, the oxide semiconductor layer (S3) blocks entry of elements (e.g., silicon) contained in the gate insulating film to the oxide semiconductor layer (S2) having a high current density. Thus, the oxide semiconductor layer (S3) preferably has a certain thickness. For example, the thickness of the oxide semiconductor layer (S3) is greater than or equal to 0.3 nm, preferably greater than or equal to 1 nm, more preferably greater than or equal to 2 nm.

The oxide semiconductor layer (S1) is preferably formed thick. The oxide semiconductor layers (S2) and (S3) are preferably formed thin. Specifically, the thickness of the oxide semiconductor layer (S1) is greater than or equal to 20 nm, preferably greater than or equal to 30 nm, more preferably greater than or equal to 40 nm, still more preferably greater than or equal to 60 nm. Specifically, the thickness of the oxide semiconductor layer (S1) is greater than or equal to 20 nm, preferably greater than or equal to 30 nm, more preferably greater than or equal to 40 nm, still more preferably greater than or equal to 60 nm. With the oxide semiconductor layer (S1) having the above thickness, the interface between the insulating film and the oxide semiconductor layer (S1) can be separated from the oxide semiconductor layer (S2) having a high current density to have a distance greater than or equal to 20 nm, preferably greater than or equal to 30 nm, more preferably greater than or equal to 40 nm, still more preferably greater than or equal to 60 nm. To prevent the productivity of the signal processing device from being lowered, the thickness of the oxide semiconductor layer (S1) is smaller than or equal to 200 nm, preferably smaller than or equal to 120 nm, more preferably smaller than or equal to 80 nm. The thickness of the oxide semiconductor layer (S2) is greater than or equal to 3 nm and less than or equal to 100 nm, preferably greater than or equal to 3 nm and less than or equal to 80 nm, more preferably greater than or equal to 3 nm and less than or equal to 50 nm.

For example, the thickness of the oxide semiconductor layer (S1) may be greater than that of the oxide semiconductor layer (S2), and the thickness of the oxide semiconductor layer (S2) may be greater than that of the oxide semiconductor layer (S3).

A single layer or a multiple layer of the above described oxide semiconductor can be used for a channel of the transistor 111 and the like.

Embodiment 2

Figure 8A:
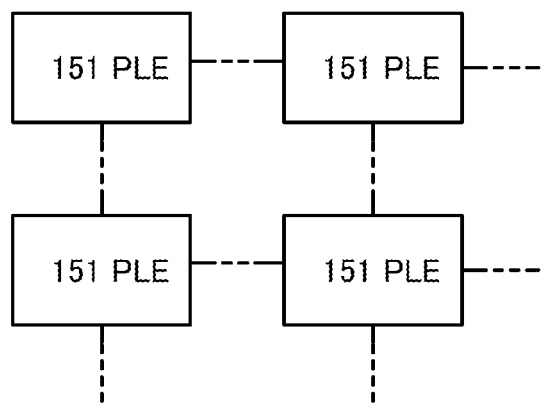
FIGS. 8A and 8B illustrate structure examples of a programmable logic device and a programmable logic element, respectively.

FIG. 8A is a block diagram illustrating the structure of a programmable logic device. Although the block diagram attached to this specification shows components classified by their functions in independent blocks, it is difficult to classify actual components according to their functions completely and it is possible for one component to have a plurality of functions.

As shown in FIG. 8A, the programmable logic device 150 includes a plurality of programmable logic elements 151. Electrical connection (possibility of connection) between the programmable logic elements 151 is controlled in accordance with configuration data including data for defining connection between the programmable logic elements 151.

Specifically, the programmable logic elements 151 can be connected to each other by a wiring element that includes a wiring group including a plurality of wirings and a switch for controlling connection between the wirings included in the wiring group in accordance with configuration data.

Figure 8B:
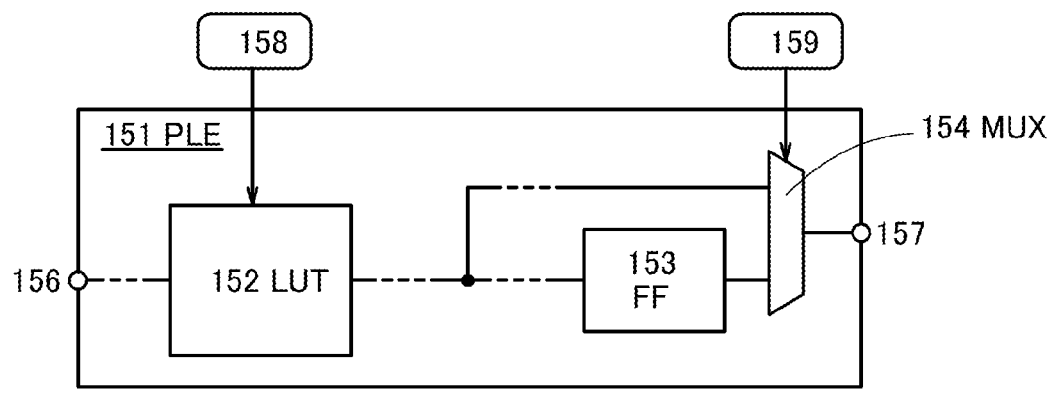

FIG. 8B is a block diagram illustrating a structure example of the programmable logic element 151. The programmable logic element 151 includes at least a lookup table 152, a flip-flop 153, and a multiplexer 154.

Configuration data 158 including data for specifying the function of the lookup table 152 as a logic gate is input to the lookup table 152. In other words, a relationship between a logic level of a signal input from a terminal 156 to the lookup table 152 and a logic level of a signal output from the lookup table 152 is determined in accordance with the configuration data 158. For example, the lookup table 152 has the circuit configuration shown in FIG. 5 or a circuit configuration obtained by developing the circuit configuration shown in FIG. 5.

An output signal from the lookup table 152 is input to the flip-flop 153. Further, an output signal from the flip-flop 153 included in one programmable logic element 151 is sometimes input to the flip-flop 153 included in another programmable logic element 151. The flip-flop 153 has a function of holding these input signals.

Configuration data 159 including data for controlling the operation of the multiplexer 154 is input to the multiplexer 154. The multiplexer 154 has a function of selecting any one of signals output from the lookup table 152 and the flip-flop 153 in accordance with the configuration data 159. A signal selected by the multiplexer 154 is output from a terminal 157 of the programmable logic element 151.

Structure Example of Programmable Logic Element

Figure 9A:
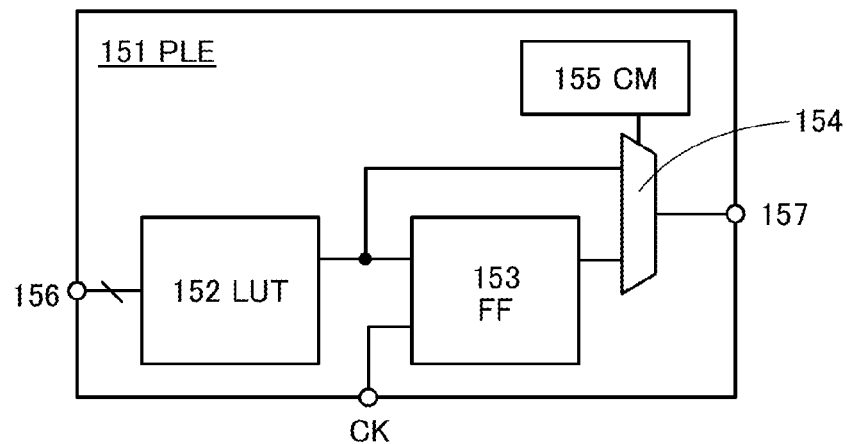
FIGS. 9A and 9B illustrate structure examples of a programmable logic element.

FIG. 9A shows a specific structure example of the programmable logic element 151 in FIG. 8B. The programmable logic element 151 in FIG. 9A includes the lookup table 152 storing configuration data, the flip-flop 153, the multiplexer 154, and a configuration memory 155 storing the configuration data 159 of the multiplexer 154.

The lookup table 152 carries out different logic operation depending on the stored configuration data. When the logical operation executed by the lookup table 152 is determined by the configuration data, the lookup table 152 generates an output signal corresponding to a plurality of input signals supplied to the terminal 156. The flip-flop 153 holds the output signal generated in the lookup table 152 and outputs an output signal corresponding to the signal in synchronization with a signal CK.

The output signals from the lookup table 152 and the flip-flop 153 are input to the multiplexer 154. The multiplexer 154 has a function of selecting and outputting one of the two output signals in accordance with configuration data stored in the configuration memory 155. The output signal from the multiplexer 154 is applied to the terminal 157.

Figure 9B:
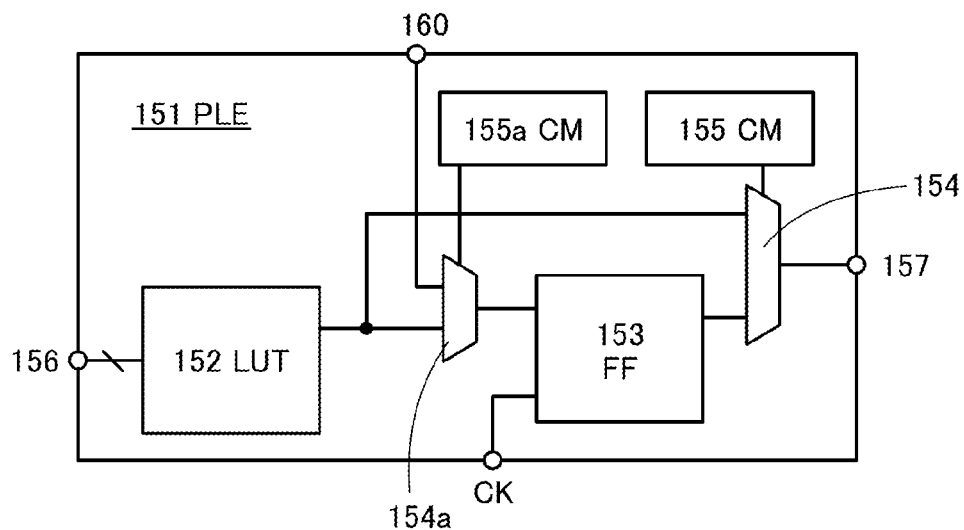

FIG. 9B shows another specific example of the programmable logic element 151 in FIG. 8B. Unlike the programmable logic element 151 in FIG. 9A, the programmable logic element 151 in FIG. 9B further includes a multiplexer 154a and a configuration memory 155a storing configuration data of the multiplexer 154a.

An output signal from the lookup table 152 and an output signal from the flip-flop 153 included in another programmable logic element 151 that is input through a terminal 160 are input to the multiplexer 154a. The multiplexer 154a has a function of selecting and outputting one of the above two output signals in accordance with configuration data stored in the configuration memory 155a.

In the programmable logic element 151 in FIG. 8B, the flip-flop 153 holds the output signal from the multiplexer 154a and outputs a signal corresponding to the output signal from the lookup table 152 in synchronization with the signal CK.

Note that in the programmable logic element 151 illustrated in FIG. 9A or FIG. 9B, configuration data may determine the kind of the flip-flop 153. Specifically, the flip-flop 153 may function as any of a D flip-flop, a T flip-flop, a JK flip-flop, and an RS flip-flop depending on the configuration data.

Structure Example 2 of Programmable Logic Element

Figure 10A:
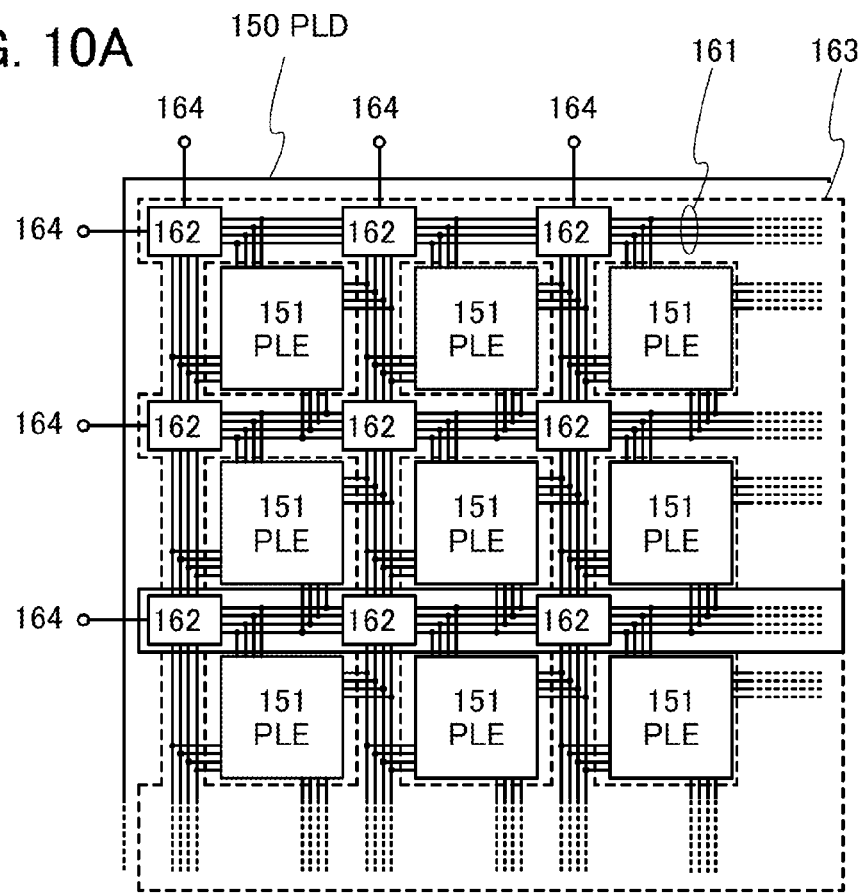
FIGS. 10A and 10B illustrate structure examples of a programmable logic device and a switch, respectively.

FIG. 10A schematically illustrates part of the structure of the programmable logic device 150 as an example. The programmable logic device 150 illustrated in FIG. 10A includes the plurality of the programmable logic elements 151, a wiring group 161 connected to any of the plurality of the programmable logic elements 151, and switches 162 which control connections between the wirings belonging to the wiring group 161. The wiring group 161 and the switches 162 constitute a routing resource 163. The connection between the wirings controlled by the switches 162 are determined by the configuration data.

Figure 10B:
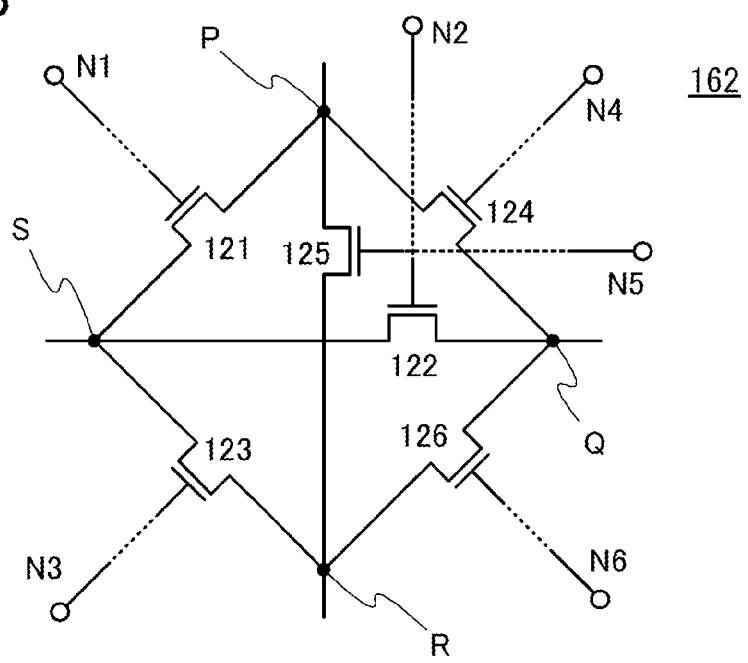

FIG. 10B illustrates a structure example of the switch 162. The switch 162 illustrated in FIG. 10B has a function of controlling connection structures between wirings which belong to the wiring group 161. Specifically, the switch 162 includes pass transistors 121 to 126. The pass transistor 121 has a function of controlling the electrical connection between a terminal P and a terminal S. The pass transistor 122 has a function of controlling the electrical connection between a terminal Q and the terminal S. The pass transistor 123 has a function of controlling the electrical connection between a terminal R and the terminal S. The pass transistor 124 has a function of controlling the electrical connection between the terminal P and the terminal Q. The pass transistor 125 has a function of controlling the electrical connection between the terminal P and the terminal R. The pass transistor 126 has a function of controlling the electrical connection between the terminal Q and the terminal R.

Gates of the pass transistors 121 to 126 are connected to the resistor 140 or the writing transistor 141 and the like as shown in FIGS. 1B and 1C, FIGS. 2A and 2B, FIG. 4, FIG. 5, and FIG. 6.

Selection (switching) of the on state or off state of each of the pass transistors 121 to 126 is determined by configuration data. Specifically, in the case of the programmable logic device 150, the potentials of signals input to gates of the pass transistors 121 to 126 are determined by configuration data.

The switches 162 also have a function of controlling electrical connection between the wiring group 161 and output terminals 164 of the programmable logic device 150.

Figure 11:
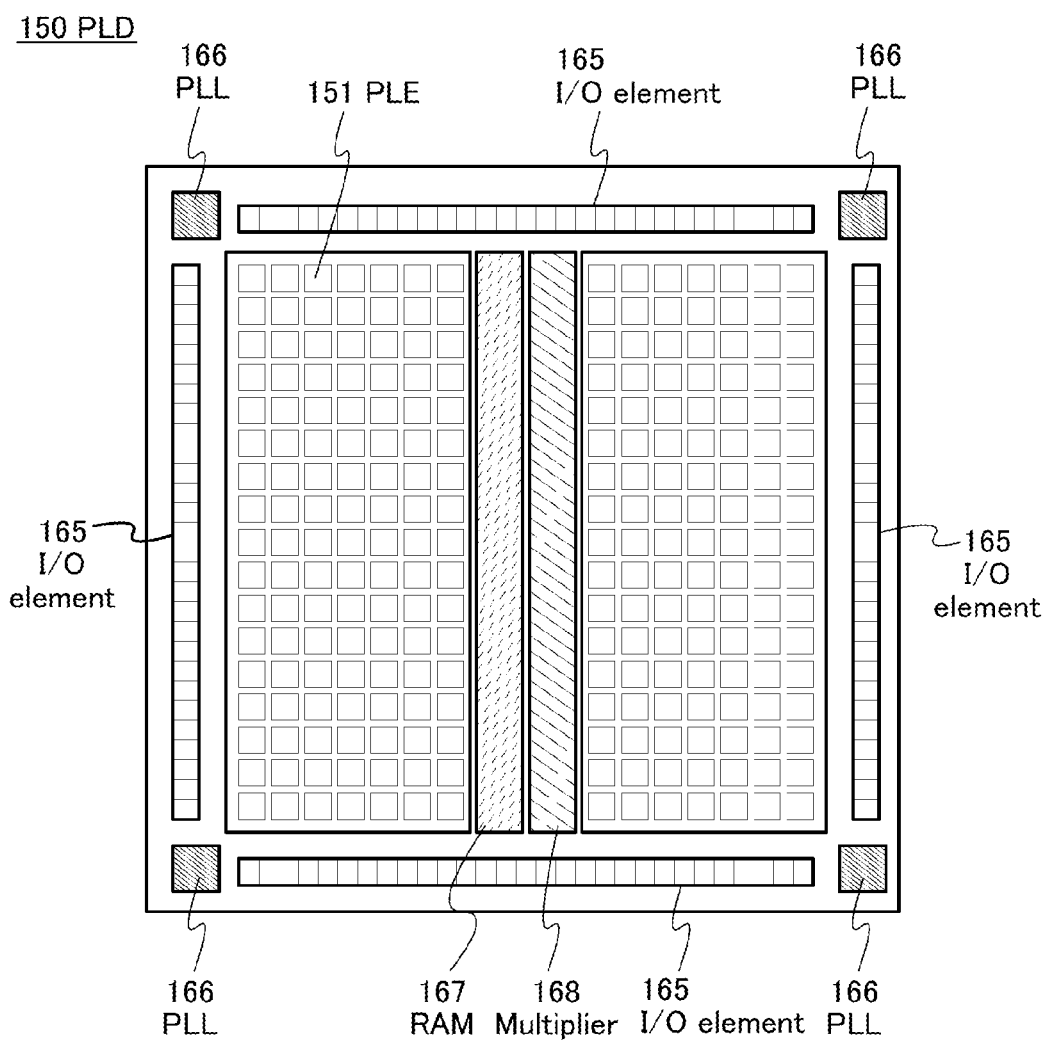
FIG. 11 illustrates a structure example of a programmable logic device.

FIG. 11 shows an entire structure example of the programmable logic device 150, as an example. In FIG. 11, I/O elements 165, phase lock loops (PLL) 166, a RAM 167, and a multiplier 168 are provided in the programmable logic device 150. The I/O element 165 functions as an interface that controls input of a signal from a circuit outside the programmable logic device 150 or output of a signal to the circuit outside the programmable logic device 150. The PLL 166 has a function of generating a signal CK. The RAM 167 has a function of storing data used for logic operation. The multiplier 168 corresponds to a logic circuit dedicated to multiplication. When the programmable logic device 150 includes a function of executing multiplication, the multiplier 168 is not necessarily provided.

Example of Manufacturing Process of Programmable Logic Device

An example of a manufacturing process of a programmable logic device is described with reference to FIGS. 12A to 12D, FIGS. 13A to 13C, and FIGS. 14A and 14B. For the details, refer to Patent Documents 1 to 3. Note that FIGS. 12A to 12D illustrate a stacked-layer structure in a simple way and do not illustrate a particular cross section.

FIGS. 13A to 13C and FIGS. 14A and 14B are layout examples of main components included in the programmable logic device in FIG. 5. A cross mark in FIGS. 13A to 13C and FIGS. 14A and 14B is a marker for indicating the same positions throughout the figures. By overlapping the markers in the figures, the positional relationships between the components can be found.

Figure 12A:
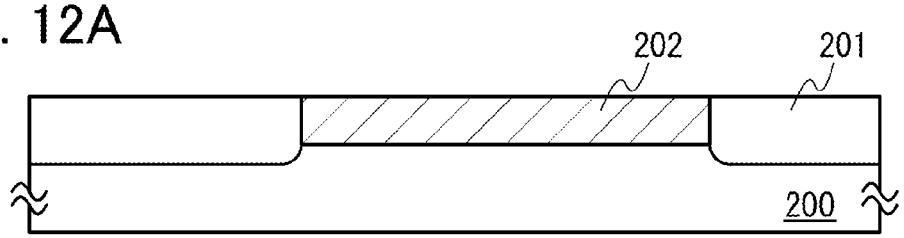
FIGS. 12A to 12D illustrate examples of steps of manufacturing a programmable logic device.
Figure 13C:
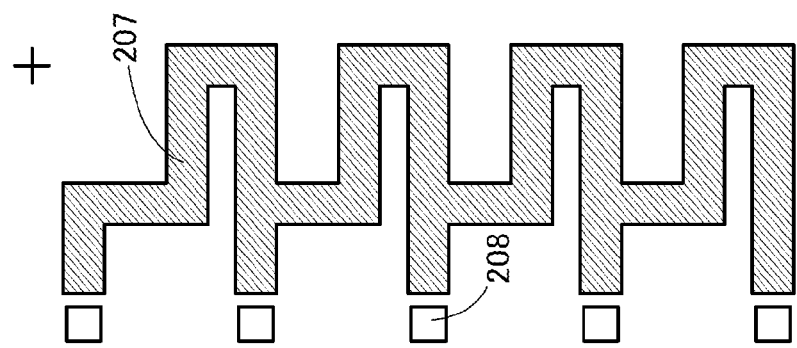
FIGS. 13A to 13C illustrate examples of layout of main components of a programmable logic device.
Figure 13B:
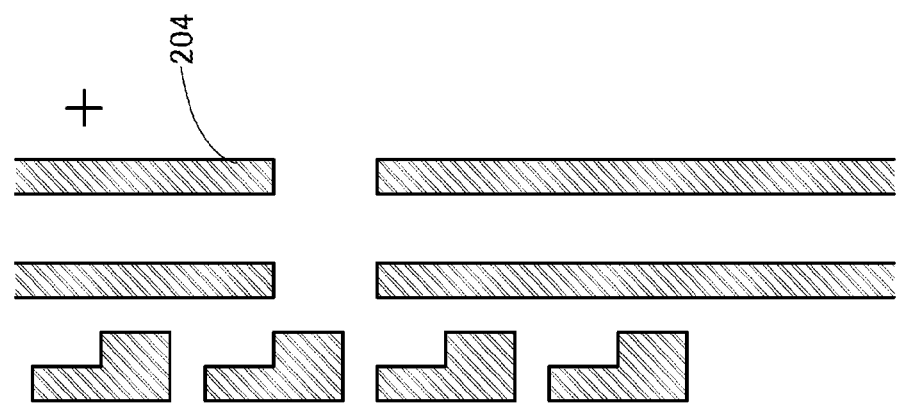
Figure 13A:
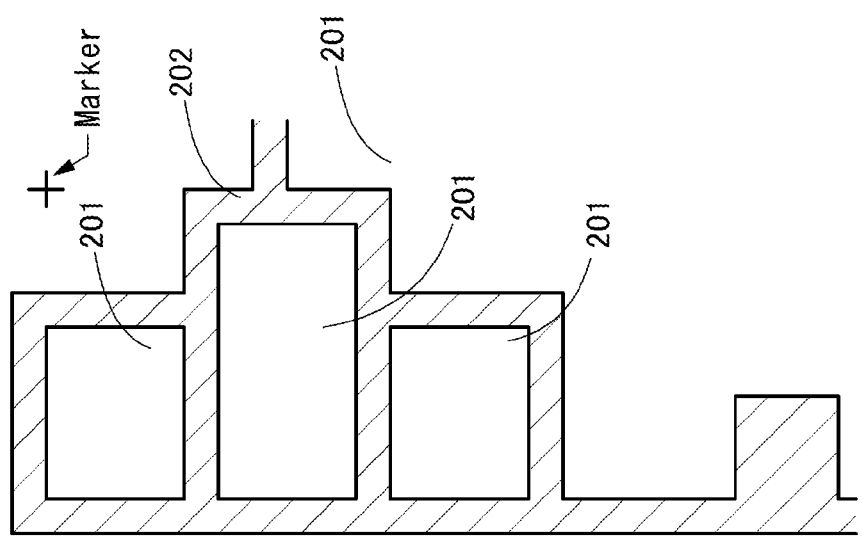

An element isolation insulator 201 and a P-type or N-type well 202 are provided over a semiconductor substrate 200 which is single-crystal, polycrystalline, or amorphous (FIG. 12A). An arrangement example of the element isolation insulator 201 and the well 202 is shown in FIG. 13A.

A first gate insulating film 203 and a first gate wiring 204 are formed. An impurity region 205 is formed in the well 202. A material having higher conductivity such as a silicide may be stacked over the impurity region.

Figure 12B:
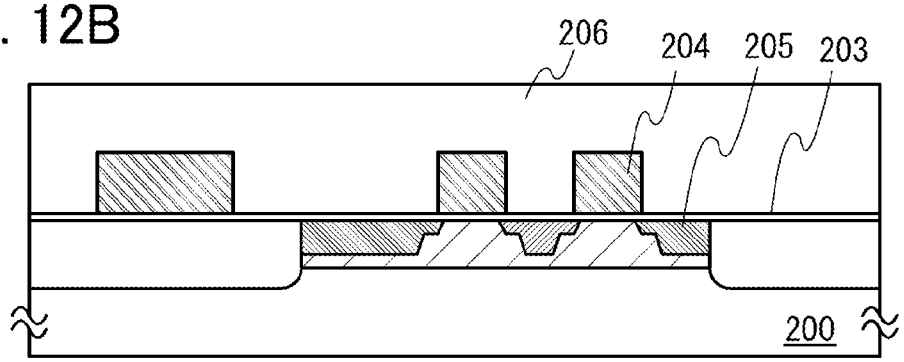

Further, an interlayer insulator 206 is provided (FIG. 12B). The interlayer insulator 206 is a single layer or a multilayer and preferably has the ability to supply oxygen to an upper layer and to stop movement of hydrogen or water from a lower layer to the upper layer. An arrangement example of the first gate wiring 204 is shown in FIG. 13B.

Figure 12C:
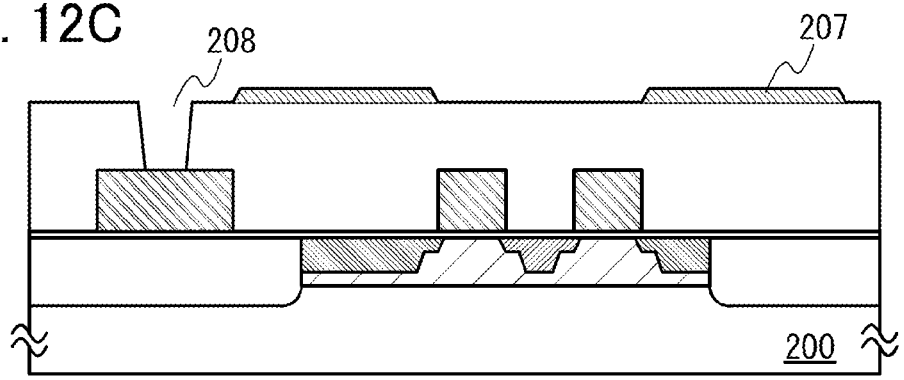

An oxide semiconductor layer 207 is provided over the interlayer insulator 206. A contact hole 208 is formed in the interlayer insulator 206 (FIG. 12C). An arrangement example of the oxide semiconductor layer 207 and the contact hole 208 is shown in FIG. 13C. Note that a semiconductor other than an oxide semiconductor may be used. For example, a silicon film having a thickness of 2 nm or less may be used.

A conductive material is deposited to fill the contact hole 208 with the conductive material. Here, the oxide semiconductor layer 207 is covered with the conductive material. The conductive material is a single layer or a multilayer. Further, the surface of the conductive material is planarized. Then, the conductive material is selectively etched to form a wiring 209. An arrangement example of the wiring 209 is shown in FIG. 14A.

Figure 12D:
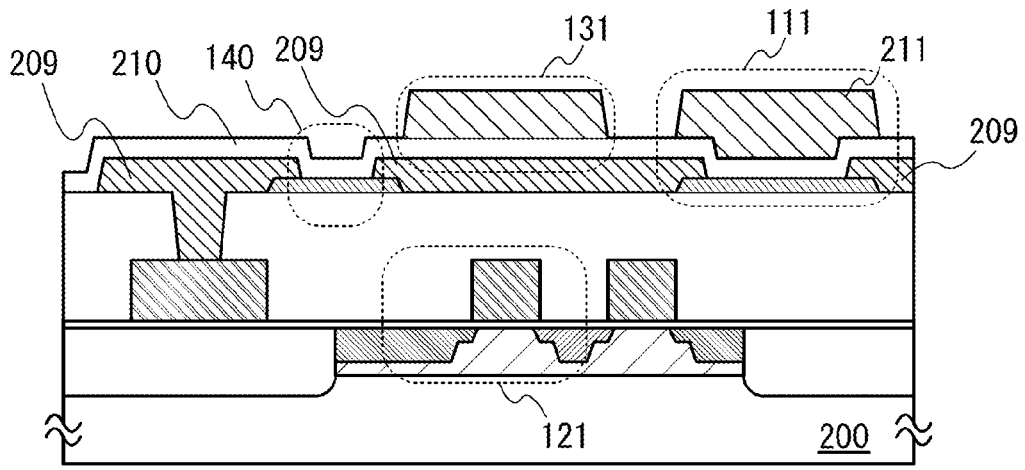

A second gate insulating film 210 covering the wiring 209 is formed. A conductive material is deposited and the surface of the material is planarized. The conductive material is a single layer or a multilayer and preferably has the ability to stop movement of hydrogen or water from the upper layer to the lower layer. The conductive material whose surface is planarized is selectively etched to form a second gate wiring 211 (FIG. 12D). An arrangement example of the second gate wiring 211 is shown in FIG. 14B.

Through the above, the writing transistor 111, the capacitor 131, and the resistor 140 in FIG. 1C can be formed. The capacitor 131 has a structure in which the second gate insulating film 210 is interposed between the wiring 209 and the second gate wiring 211.

Note that as shown in FIG. 13C, a channel of the wiring transistor 111 is bent, long, and narrow. Thus, a short-channel effect is small and the off-state resistance is high. On the other hand, because the on-state resistance is also high, writing of data takes long time. However, it is less of an obstacle in practical use because writing of data is hardly performed frequently in a programmable logic device.

Further, the oxide semiconductor layer 207 has bifurcations where the second gate wiring does not overlap, functioning as resistors. A conductive layer is not provided on the resistor, which prevents generation of a large parasitic capacitance on the resistor.

This application is based on Japanese Patent Application serial no. 2013-105904 filed with Japan Patent Office on May 20, 2013, the entire contents of which are hereby incorporated by reference.

What is claimed is:
1. A signal processing device comprising:
a first transistor;
a second transistor;
a third transistor;
a capacitor;

a first node at which a gate of the first transistor and a one of a source and a drain of the third transistor are connected; and a second node at which one of a source and a drain of the second transistor, the other of the source and the drain of the third transistor, and a first electrode of the capacitor are connected, wherein switching of the second transistor and switching of the third transistor are synchronized.

2. The signal processing device according to claim 1, wherein the second transistor comprises a thin semiconductor layer, and
wherein the thin semiconductor layer is an oxide.

3. The signal processing device according to claim 1, wherein the first transistor comprises a single crystal semiconductor.

4. The signal processing device according to claim 1, wherein a gate of the second transistor and a second electrode of the capacitor are formed using the same conductive material.

5. The signal processing device according to claim 1, wherein the second transistor comprises a backgate.

6. The signal processing device according to claim 1, wherein one of a source and a drain of the first transistor and the other of the source and the drain of the second transistor are electrically connected to each other.

7. The signal processing device according to claim 1, wherein each of the first transistor and the second transistor is an N-channel transistor.

8. The signal processing device according to claim 1, wherein one of a source and a drain of the first transistor is configured to be supplied with data when the first node is floated.

9. The signal processing device according to claim 1, wherein a capacitance of the second node including a parasitic capacitance is larger than 10 times a capacitance of the first node including a parasitic capacitance.

10. A signal processing device comprising:
a first transistor;
a second transistor;
a resistor;
a capacitor;
a first node at which a gate of the first transistor and a first electrode of the resistor are connected; and
a second node at which one of a source and a drain of the second transistor, the a second electrode of the resistor, and a first electrode of the capacitor are connected.

11. The signal processing device according to claim 10, wherein the second transistor comprises a thin semiconductor layer, and
wherein the thin semiconductor layer is an oxide.

12. The signal processing device according to claim 10, wherein the first transistor comprises a single crystal semiconductor.

13. The signal processing device according to claim 10, wherein a gate of the second transistor and a second electrode of the capacitor are formed using the same conductive material.

14. The signal processing device according to claim 10, wherein the second transistor comprises a backgate.

15. The signal processing device according to claim 10, wherein one of a source and a drain of the first transistor and the other of the source and the drain of the second transistor are electrically connected to each other.

16. The signal processing device according to claim 10, wherein each of the first transistor and the second transistor is an N-channel transistor.

17. The signal processing device according to claim 10, wherein one of a source and a drain of the first transistor is configured to be supplied with data when the first node is floated.

18. The signal processing device according to claim 10, wherein a capacitance of the second node including a parasitic capacitance is larger than 10 times a capacitance of the first node including a parasitic capacitance.

* * * * *